(12) United States Patent
Yang et al.

(10) Patent No.: US 12,262,533 B2
(45) Date of Patent: Mar. 25, 2025

(54) DYNAMIC FLASH MEMORY (DFM) WITH MULTI-CELLS

(71) Applicant: Yangtze Memory Technologies Co., Ltd., Hubei (CN)

(72) Inventors: Tao Yang, Hubei (CN); Dongxue Zhao, Hubei (CN); Yuancheng Yang, Hubei (CN); Lei Liu, Hubei (CN); Kun Zhang, Hubei (CN); Di Wang, Hubei (CN); Wenxi Zhou, Hubei (CN); Zhiliang Xia, Hubei (CN); Zongliang Huo, Hubei (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 349 days.

(21) Appl. No.: 17/731,524

(22) Filed: Apr. 28, 2022

(65) Prior Publication Data

US 2023/0354599 A1 Nov. 2, 2023

(51) Int. Cl.
*H01L 23/52* (2006.01)
*H01L 23/528* (2006.01)
(Continued)

(52) U.S. Cl.
CPC ......... *H10B 41/35* (2023.02); *H01L 23/5283* (2013.01); *H10B 41/27* (2023.02); *H10B 43/27* (2023.02); *H10B 43/35* (2023.02)

(58) Field of Classification Search
CPC ........ H10B 41/35; H10B 41/27; H10B 43/27; H10B 43/35; H10B 12/50; H10B 12/03;
(Continued)

(56) References Cited

U.S. PATENT DOCUMENTS 10,867,678 B2  12/2020  Chen et al.
2022/0320097 A1*  10/2022  Harada ................. H10B 12/20
(Continued)

FOREIGN PATENT DOCUMENTS

WO  WO-2022219767 A1 *  10/2022  ......... G11C 11/4023

OTHER PUBLICATIONS

Koji Sakui and Nozomu Harada, "Dynamic Flash Memory with Dual Gate Surrounding Gate Transistor (SGT)," 2021 IEEE International Memory Workshop (IMW), May 16, 2021, DOI: 10.1109/IMW51353.2021.9439614, 4 pages.
(Continued)

*Primary Examiner* — Mohammed Shamsuzzaman
(74) *Attorney, Agent, or Firm* — Conley Rose, P.C.

(57) ABSTRACT

A three-dimensional (3D) memory device includes a first memory cell, a second memory cell, a control gate between the first and second memory cells, a top contact coupled to the first memory cell, and a bottom contact coupled to the second memory cell. The first memory cell can include a first pillar, a first insulating layer surrounding the first pillar, a first gate contact coupled to a first word line, and a second gate contact coupled to a first plate line. The second memory cell can include a second pillar, a second insulating layer surrounding the second pillar, a third gate contact coupled to a second word line, and a fourth gate contact coupled to a second plate line. The 3D memory device can utilize dynamic flash memory (DFM), increase storage density, provide multi-cell storage, provide a three-state logic, decrease leakage current, increase retention time, and decrease refresh rates.

14 Claims, 20 Drawing Sheets

(51) Int. Cl.
    *H10B 41/27*    (2023.01)
    *H10B 41/35*    (2023.01)
    *H10B 43/27*    (2023.01)
    *H10B 43/35*    (2023.01)

(58) Field of Classification Search
    CPC ..... H10B 12/05; H10B 12/20; H01L 23/5283; G11C 11/404; G11C 16/0425
    See application file for complete search history.

(56) References Cited

U.S. PATENT DOCUMENTS

2023/0354577 A1* 11/2023 Zhao .................. H10B 43/27
2023/0354578 A1* 11/2023 Wang .................. H10B 12/05
2023/0354579 A1* 11/2023 Yang ................. H01L 29/78642

OTHER PUBLICATIONS

"Unisantis unveils Dynamic Flash Memory as DRAM alternative: Benefits in higher density, speed and cost savings," Unisantis Electronics, May 19, 2021, https://unisantis.com/wp-content/uploads/2021/05/Unisantis_DFM.pdf, 3 pages.

* cited by examiner

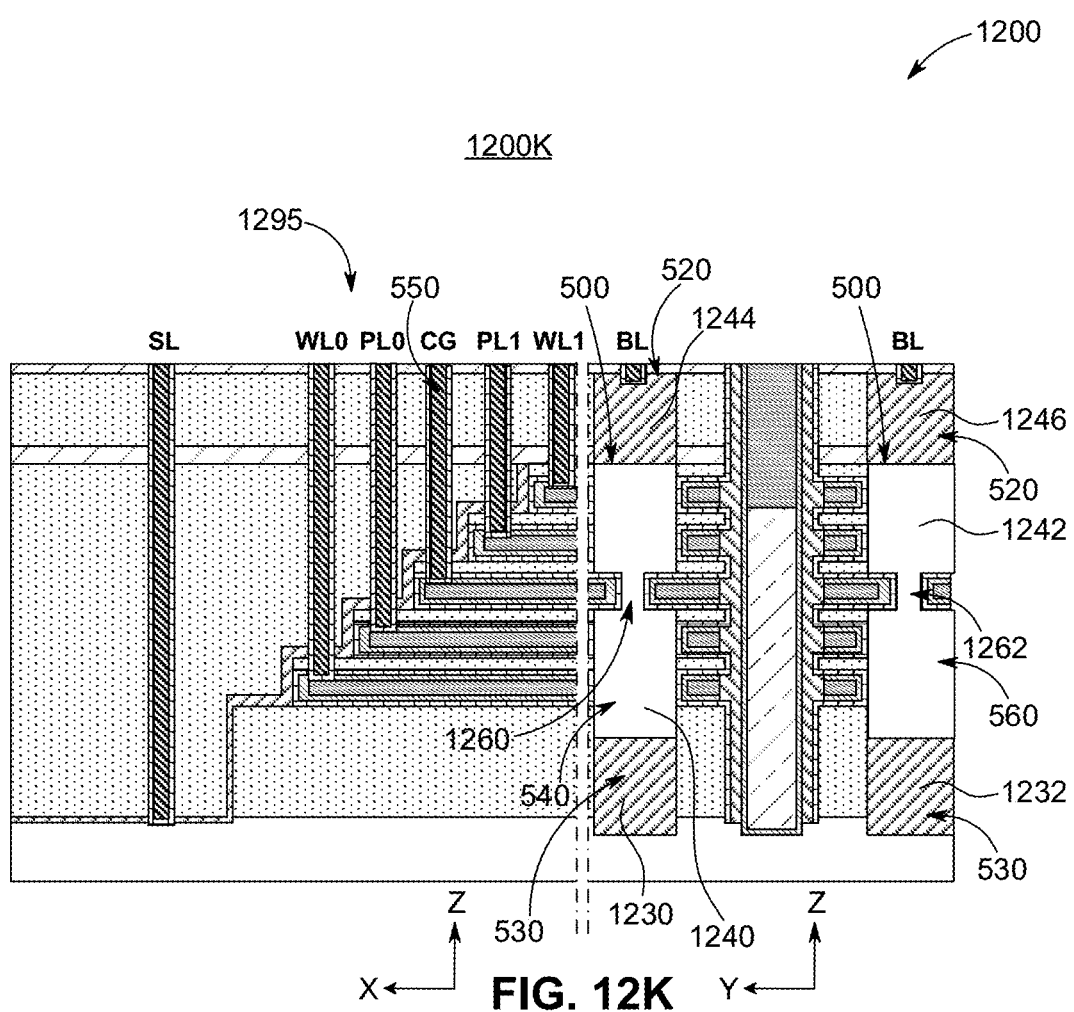

DYNAMIC FLASH MEMORY (DFM) WITH MULTI-CELLS

BACKGROUND

Field

The present disclosure relates to dynamic flash memory (DFM) apparatuses, systems, and methods, for example, multi-cell DFM apparatuses, systems, and methods to increase storage density in a three-dimensional (3D) memory device.

Background

Dynamic random-access memory (DRAM) is a volatile memory that uses charge stored on a capacitor to represent information. DRAM stores each bit in a memory cell that includes a transistor and a capacitor (e.g., 1T1C). Charge levels greater than a certain threshold can represent a first logic level (e.g., 1 state) and charge levels less than another threshold amount can represent a second logic level (e.g., 0 state). Leakage currents and various parasitic effects limit the length of time a capacitor can hold charge and regular refresh cycles are needed. DRAM retention times can be as low as 32 ms during high temperature operations (e.g., above 85° C.) and can require refresh rates of about 31 Hz.

Flash memory (flash) is a non-volatile memory that uses charge stored on a floating gate to represent information. Flash stores each bit in a memory cell that includes a transistor with a floating gate. The amount of charge on the floating gate will determine whether the transistor will conduct when a fixed set of read bias conditions are applied. Flash can retain charge for a long period of time (e.g., about 10 years at 85° C.) since the floating gate is completely surrounded by insulators. Further, the act of reading the data can be performed non-destructively without loss of the information. In addition, flash can quickly erase entire blocks or pages of data simultaneously (e.g., NAND flash).

Current 1T1C DRAM is approaching a process limit. The manufacturing of 1T1C DRAM devices with small-node capacitors to retain charge is becoming more difficult due to increased current leakage, increased power consumption, degraded operating voltage margins, and decreased retention times. Further, current single transistor (1T) capacitor-free DRAM (e.g., ZRAM, TTRAM, ARAM, etc.) devices need further improvement and optimization for manufacturable integration and operation solutions.

SUMMARY

Accordingly, there is a need to, e.g., provide a capacitor-free dynamic random-access memory device to increase memory storage density. Further, there is a need to provide multi-cell storage designs and provide multi-state (e.g., three-state) logic. Further, there is a need to decrease leakage current, decrease junction current, and decrease power consumption. Further, there is a need to increase charge retention times and decrease refresh rates.

In some aspects, a three-dimensional (3D) memory device can include a first memory cell, a second memory cell, a control gate between the first and second memory cells, a top contact coupled to the first memory cell, and a bottom contact coupled to the second memory cell. In some aspects, the 3D memory device can increase storage density, provide multi-cell storage, provide a three-state logic, decrease leakage current, decrease junction current, decrease power consumption, increase retention time, and decrease refresh rates.

In some aspects, the first memory cell can include a first pillar, a first insulating layer, a first gate contact, and a second gate contact. In some aspects, the first pillar can be configured to store a first electrical charge. In some aspects, the first insulating layer can surround the first pillar. In some aspects, the first gate contact can surround a first portion of the first insulating layer. In some aspects, the first gate contact can be coupled to a first word line configured to address and non-destructively read the first pillar. In some aspects, the second gate contact can surround a second portion of the first insulating layer. In some aspects, the second gate contact can be coupled to a first plate line configured to program the first pillar.

In some aspects, the second memory cell can include a second pillar, a second insulating layer, a third gate contact, and a fourth gate contact. In some aspects, the second pillar can be configured to store a second electrical charge. In some aspects, the second insulating layer can surround the second pillar. In some aspects, the third gate contact can surround a first portion of the second insulating layer. In some aspects, the third gate contact can be coupled to a second word line configured to address and non-destructively read the second pillar. In some aspects, the fourth gate contact can surround a second portion of the second insulating layer. In some aspects, the fourth gate contact can be coupled to a second plate line configured to program the second pillar.

In some aspects, the control gate between the first and second memory cells can be configured to provide a charge isolation region between the first and second memory cells. In some aspects, the control gate can include a recessed pillar, a recessed insulating layer, and a control gate contact. In some aspects, the recessed insulating layer can surround the recessed pillar. In some aspects, the control gate contact can surround the recessed insulating layer. In some aspects, the control gate can invert a channel in the recessed pillar to form the charge (e.g., hole) isolation region.

In some aspects, the top contact can be coupled to a bit line configured to flow electrical charge through and/or away from the first and second memory cells. In some aspects, the bottom contact can be coupled to a source line configured to flow electrical charge through and/or away from the first and second memory cells. In some aspects, different voltage combinations can be applied to the bit line, the first word line, the first plate line, the control gate, the second word line, the second plate line, and the source line to perform read (e.g., non-destructively), program (e.g., 0.5 state, 1 state), and erase (e.g., 0 state) operations on the 3D memory device.

In some aspects, the first pillar, the recessed pillar, and the second pillar can be a monolithic vertical pillar. In some aspects, the monolithic vertical pillar can be a single semiconductor material (e.g., silicon, doped silicon, monocrystalline silicon, etc.). In some aspects, the monolithic vertical pillar can decrease defect concentrations, increase charge conduction, decrease leakage current, and increase manufacturing efficiency.

In some aspects, the first insulating layer, the recessed insulating layer, and the second insulating layer can be a monolithic insulating layer. In some aspects, the monolithic insulating layer can be a single dielectric material (e.g., high-k dielectric, oxide, nitride, silicon oxide, silicon nitride, glass, spin-on-glass (SOG), etc.). In some aspects, the monolithic insulating layer can decrease defect concentrations, increase gate capacitance, decrease leakage current, and increase manufacturing efficiency.

In some aspects, the 3D memory device can include a three-state logic. In some aspects, the 3D memory device can include a 0 logic state, a 0.5 logic state, and a 1 logic state. In some aspects, the 3D memory device can be configured to increase storage density. In some aspects, the 3D memory device can include a multi-state logic (e.g., 0 state, 0.5 state, 1 state).

In some aspects, the first and second memory cells can be configured to be independently addressed. In some aspects, different voltage combinations can be applied to the bit line, the first word line, the first plate line, the control gate, the second word line, the second plate line, and the source line to address the first memory cell and/or the second memory cell. In some aspects, the first and second memory cells can be configured to be charged separately. In some aspects, different voltage combinations can be applied to the bit line, the first word line, the first plate line, the control gate, the second word line, the second plate line, and the source line to separately charge the first memory cell and/or the second memory cell.

In some aspects, in a first logic state, the first pillar of the first memory cell can include the first electrical charge. In some aspects, different voltage combinations can be applied to the bit line, the first word line, the first plate line, the control gate, the second word line, the second plate line, and the source line to perform a program (e.g., 0.5 state) operation on the first memory cell to store the first electrical charge on the first pillar.

In some aspects, in the first logic state (e.g., 0.5 state), the top contact can have a HIGH level voltage, the first gate contact can have a HIGH level voltage, the second gate contact can have a HIGH level voltage, the control gate contact can have a HIGH level voltage, the third gate contact can have a HIGH level voltage, the fourth gate contact can have a HIGH level voltage, and the bottom contact can have a LOW level voltage (e.g., GND).

In some aspects, in the first logic state (e.g., 0.5 state), the top contact can have a voltage of about 0.5 V to about 1.2 V, the first gate contact can have a voltage of about 1 V to about 2 V, the second gate contact can have a voltage of about 0.5 V to about 1.2 V, the control gate contact can have a voltage of about 0.8 V to about 1.5 V, the third gate contact can have a voltage of about 0.5 V to about 1.5 V, the fourth gate contact can have a voltage of about 0.5 V to about 1.2 V, and the bottom contact can have a voltage of about 0 V.

In some aspects, in a second logic state, the first pillar of the first memory cell can include the first electrical charge and the second pillar of the second memory cell can include the second electrical charge. In some aspects, different voltage combinations can be applied to the bit line, the first word line, the first plate line, the control gate, the second word line, the second plate line, and the source line to perform a program (e.g., 1 state) operation on the first and second memory cells to store the first electrical charge on the first pillar and store the second electrical charge on the second pillar.

In some aspects, in the second logic state (e.g., 1 state), the top contact can have a HIGH level voltage, the first gate contact can have a HIGH level voltage, the second gate contact can have a HIGH level voltage, the control gate contact can have a HIGH level voltage, the third gate contact can have a HIGH level voltage, the fourth gate contact can have a HIGH level voltage, and the bottom contact can have a LOW level voltage (e.g., GND).

In some aspects, in the second logic state (e.g., 1 state), the top contact can have a voltage of about 0.8 V to about 1.5 V, the first gate contact can have a voltage of about 1 V to about 2 V, the second gate contact can have a voltage of about 0.5 V to about 1.2 V, the control gate contact can have a voltage of about 0.8 V to about 1.5 V, the third gate contact can have a voltage of about 0.5 V to about 1.5 V, the fourth gate contact can have a voltage of about 0.5 V to about 1.2 V, and the bottom contact can have a voltage of about 0 V.

In some aspects, in a third logic state, the first pillar of the first memory cell and the second pillar of the second memory cell can include substantially no electrical charge. In some aspects, different voltage combinations can be applied to the bit line, the first word line, the first plate line, the control gate, the second word line, the second plate line, and the source line to perform an erase (e.g., 0 state) operation on the first and second memory cells to remove the first electrical charge on the first pillar and/or the second electrical charge on the second pillar.

In some aspects, in the third logic state (e.g., 0 state), the top contact can have a LOW level voltage (e.g., GND), the first gate contact can have a LOW level voltage (e.g., GND), the second gate contact can have a HIGH level voltage, the control gate contact can have a HIGH level voltage, the third gate contact can have a HIGH level voltage, the fourth gate contact can have a HIGH level voltage, and the bottom contact can have a HIGH level voltage.

In some aspects, in the third logic state (e.g., 0 state), the top contact can have a voltage of about 0 V, the first gate contact can have a voltage of about 0 V, the second gate contact can have a voltage of about 0.5 V to about 1.5 V, the control gate contact can have a voltage of about 0.5 V to about 1.5 V, the third gate contact can have a voltage of about 0.5 V to about 1.5 V, the fourth gate contact can have a voltage of about 0.5 V to about 1.5 V, and the bottom contact can have a voltage of about −1 V to about −3 V.

In some aspects, the 3D memory device can perform a block erase operation. In some aspects, different voltage combinations can be applied to the bit line, the first word line, the first plate line, the control gate, the second word line, the second plate line, and the source line to perform a block erase (e.g., 0 state) operation on a plurality of 3D memory devices in a memory block simultaneously.

In some aspects, the 3D memory device can perform a refresh operation. In some aspects, different voltage combinations can be applied to the bit line, the first word line, the first plate line, the control gate, the second word line, the second plate line, and the source line to perform a refresh (e.g., "0 state" refresh, "0.5 state" refresh, "1 state" refresh) operation on the first and second memory cells.

In some aspects, the 3D memory device can perform a block refresh operation. In some aspects, different voltage combinations can be applied to the bit line, the first word line, the first plate line, the control gate, the second word line, the second plate line, and the source line to perform a block refresh (e.g., "0 state" refresh, "0.5 state" refresh, "1 state" refresh) operation on a plurality of 3D memory devices in a memory block simultaneously.

In some aspects, the 3D memory device can have a charge retention time of at least 100 ms. In some aspects, the 3D memory device can have a charge retention time of at least 100 ms during high temperature operation (e.g., greater than 85° C.).

In some aspects, the 3D memory device can have a refresh rate of no greater than 10 Hz. In some aspects, the 3D memory device can have a refresh rate of no greater than 10 Hz during high temperature operation (e.g., greater than 85° C.).

In some aspects, a vertical three-dimensional (3D) memory device can include a first memory cell, a second memory cell, a control gate between the first and second memory cells, a top contact coupled to the first memory cell, and a bottom contact coupled to the second memory cell. In some aspects, the first memory cell can be configured to read, program, and erase electrical charge. In some aspects, the second memory cell can be configured to read, program, and erase electrical charge. In some aspects, the control gate can be configured to provide a charge isolation region between the first and second memory cells. In some aspects, the top contact can be coupled to a bit line. In some aspects, the bit line can be configured to address the first and second memory cells and to flow electrical charge through and/or away from the first and second memory cells. In some aspects, the bottom contact can be coupled to a source line. In some aspects, the source line can be configured to address the first and second memory cells and to flow electrical charge through and/or away from the first and second memory cells. In some aspects, the vertical 3D memory device can increase storage density, provide multi-cell storage, provide a three-state logic, decrease leakage current, decrease junction current, decrease power consumption, increase retention time, and decrease refresh rates.

In some aspects, the vertical 3D memory device can include a dynamic flash memory (DFM) device. In some aspects, the top contact, the first memory cell, the control gate, the second memory cell, and the bottom contact can form a DFM device. In some aspects, the DFM device can increase storage density, provide multi-cell storage, provide a three-state logic, decrease leakage current, decrease junction current, decrease power consumption, increase retention time, and decrease refresh rates.

In some aspects, the vertical 3D memory device can include a NAND DFM device. In some aspects, the vertical 3D memory device can include floating-gate transistors (e.g., memory strings) connected in series that resemble a NAND gate.

In some aspects, the top contact can be n-type (e.g., n+), the first memory cell can be p-type (e.g., p), the control gate can be p-type (e.g., p), the second memory cell can be p-type (e.g., p), and the bottom contact can be n-type (e.g., n+) so that the vertical 3D memory device forms p-type surrounding gate transistors (SGTs) with hole charge carriers. In some aspects, when activated (e.g., source line voltage applied) hole carriers flow through the first and second memory cells from the bottom contact (e.g., source) to the top contact (e.g., drain).

In some aspects, in a first configuration, the top contact can have a HIGH level voltage, the control gate can have a HIGH level voltage, the bottom contact can have a LOW level voltage (e.g., GND), and the first memory cell can include a first electrical charge. In some aspects, in the first configuration, the top contact can have a voltage of about 0.5 V to about 1.2 V, the control gate can have a voltage of about 0.8 V to about 1.5 V, and the bottom contact can have a voltage of about 0 V. In some aspects, different voltage combinations can be applied to the bit line, the first memory cell, the control gate, the second memory cell, and the source line to perform a program (e.g., 0.5 state) operation on the first memory cell to store the first electrical charge.

In some aspects, in a second configuration, the top contact can have a HIGH level voltage, the control gate can have a HIGH level voltage, the bottom contact can have a LOW level voltage (e.g., GND), the first memory cell can include a first electrical charge, and the second memory cell can include a second electrical charge. In some aspects, in the second configuration, the top contact can have a voltage of about 0.8 V to about 1.5 V, the control gate can have a voltage of about 0.8 V to about 1.5 V, and the bottom contact can have a voltage of about 0 V. In some aspects, different voltage combinations can be applied to the bit line, the first memory cell, the control gate, the second memory cell, and the source line to perform a program (e.g., 1 state) operation on the first memory cell to store the first electrical charge and on the second memory cell to store the second electrical charge.

In some aspects, in a third configuration, the top contact can have a LOW level voltage (e.g., GND), the control gate can have a HIGH level voltage, the bottom contact can have a HIGH level voltage, and the first and second memory cells can include substantially no electrical charge. In some aspects, in the third configuration, the top contact can have a voltage of about 0 V, the control gate can have a voltage of about 0.5 V to about 1.5 V, and the bottom contact can have a voltage of about −1 V to about −3 V. In some aspects, different voltage combinations can be applied to the bit line, the first memory cell, the control gate, the second memory cell, and the source line to perform an erase (e.g., 0 state) operation on the first and second memory cells to remove substantially all electrical charge on the first and second memory cells.

In some aspects, the charge isolation region has a charge density of no greater than $1 \times 10^{14}$ cm$^{-3}$. In some aspects, the charge isolation region can isolate charge (e.g., holes) in the first memory cell and the second memory cell for multi-cell storage, independent addressing, and/or separate charging (e.g., programming).

In some aspects, the first memory cell can include a first pillar configured to store a first electrical charge, a first insulating layer surrounding the first pillar, a first gate contact surrounding a first portion of the first insulating layer, and a second gate contact surrounding a second portion of the first insulating layer. In some aspects, the first gate contact can be coupled to a first word line configured to address and non-destructively read the first pillar. In some aspects, the second gate contact can be coupled to a first plate line configured to program the first pillar.

In some aspects, the second memory cell can include a second pillar configured to store a second electrical charge, a second insulating layer surrounding the second pillar, a third gate contact surrounding a first portion of the second insulating layer, and a fourth gate contact surrounding a second portion of the second insulating layer. In some aspects, the third gate contact can be coupled to a second word line configured to address and non-destructively read the second pillar. In some aspects, the fourth gate contact can be coupled to a second plate line configured to program the second pillar.

In some aspects, the second and fourth gate contacts can be between the first and third gate contacts. In some aspects, the first word line can be between the bit line and the first plate line and the second word line can be between the second plate line and the source line.

In some aspects, a method for forming a three-dimensional (3D) memory device can include forming an alternating dielectric stack atop a substrate. In some aspects, the alternating dielectric stack can include a sacrificial layer. In some aspects, the method can further include forming a channel trench in the alternating dielectric stack. In some aspects, the method can further include forming a bottom contact in the channel trench. In some aspects, the method can further include forming a pillar atop the bottom contact. In some aspects, the method can further include forming a top contact atop the pillar. In some aspects, the method can further include forming a gate line trench in the alternating dielectric stack. In some aspects, the method can further include removing the sacrificial layer in the alternating dielectric stack. In some aspects, the method can further include recessing a portion of the pillar to form a control gate between a first memory cell and a second memory cell. In some aspects, the first memory cell can be coupled to the top contact and the second memory cell can be coupled to the bottom contact. In some aspects, the method can further include removing a portion of the alternating dielectric stack. In some aspects, the method can further include forming a high-k dielectric and conductive gate stack in the removed portion of the alternating dielectric stack. In some aspects, the method can further include forming a gate line slit in the gate line trench. In some aspects, the method can further include forming interconnects to the top contact, the first memory cell, the control gate, the second memory cell, and the bottom contact. In some aspects, storage density can be improved, multi-cell storage can be provided, multi-state logic (e.g., three-state logic) can be provided, leakage current can be decreased, junction current can be decreased, power consumption can be decreased, retention time can be increased, refresh rates can be decreased, and manufacturing efficiency and yield can be increased.

In some aspects, the sacrificial layer can be silicon, polysilicon, aluminum, chromium, gold, platinum, titanium, tungsten, or any other material not reactive to silicon oxide and silicon nitride etchants. In some aspects, the sacrificial layer can be polysilicon.

In some aspects, the removing the sacrificial layer can include etching the sacrificial layer with tetramethylammonium hydroxide (TMAH), potassium hydroxide (KOH), ethylenediamine pyrocatechol (EDP), hydrochloric acid (HCl), aqua regia, SC1 solution (NH4OH:H2O2:H2O), chlorine (Cl2), carbon tetrachloride (CCl4), boron trichloride (BCl3), or any other etchant not reactive to silicon oxide and silicon nitride. In some aspects, the sacrificial layer can be polysilicon and the polysilicon can be removed by TMAH or SC1 solution.

In some aspects, the recessing the portion of the pillar can include etching the pillar at about a midline of the pillar to form a recessed pillar between the first and second memory cells. In some aspects, the recessed pillar can have a diameter of about 20 nm to about 30 nm. In some aspects, the recessed pillar can have a diameter reduction of about 40% to about 60% relative to a diameter of the pillar.

In some aspects, the forming the bottom contact can include epitaxially growing a conductive layer. In some aspects, the forming the bottom contact can include epitaxially growing a doped semiconductor (e.g., silicon). In some aspects, the forming the bottom contact can include a selective epitaxial growth (SEG) process.

In some aspects, the forming the pillar can include epitaxially growing a semiconductor layer. In some aspects, the pillar can be a monolithic vertical pillar. In some aspects, the pillar can be a single semiconductor material (e.g., silicon, doped silicon, monocrystalline silicon, etc.). In some aspects, the pillar can be a monocrystalline material (e.g., silicon, germanium, Group IV semiconductor, Group III-V semiconductor, Group II-VI semiconductor, graphene, sapphire, etc.).

In some aspects, the forming the top contact can include doping the pillar to form a conductive layer. In some aspects, the doping the pillar can include ion implantation. In some aspects, the pillar can include ion implanted dopants to form the top contact. In some aspects, forming the top contact can include epitaxially growing a doped semiconductor (e.g., silicon). In some aspects, forming the top contact can include a SEG process.

In some aspects, the removing the portion of the alternating dielectric stack can include isotropically etching silicon nitride from a lateral edge of the 3D memory device.

In some aspects, the method includes forming a DFM device. In some aspects, forming the top contact, the first memory cell, the control gate, the second memory cell, and the bottom contact can form a DFM device. In some aspects, the formed DFM device can increase storage density, provide multi-cell storage, provide a three-state logic, decrease leakage current, decrease junction current, decrease power consumption, increase retention time, and decrease refresh rates.

In some aspects, the method includes forming a NAND DFM device. In some aspects, forming the NAND DFM device can include forming floating-gate transistors (e.g., memory strings) connected in series that resemble a NAND gate.

Implementations of any of the techniques described above may include a system, a method, a process, a device, and/or an apparatus. The details of one or more implementations are set forth in the accompanying drawings and the description below. Other features will be apparent from the description and drawings, and from the claims.

Further features and exemplary aspects of the aspects, as well as the structure and operation of various aspects, are described in detail below with reference to the accompanying drawings. It is noted that the aspects are not limited to the specific aspects described herein. Such aspects are presented herein for illustrative purposes only. Additional aspects will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the aspects and, together with the description, further serve to explain the principles of the aspects and to enable a person skilled in the relevant art(s) to make and use the aspects.

FIGS. 12A through 12K illustrate a manufacturing method for forming the multi-cell DFM device shown in FIG. 5, according to exemplary aspects.

Figure 1:
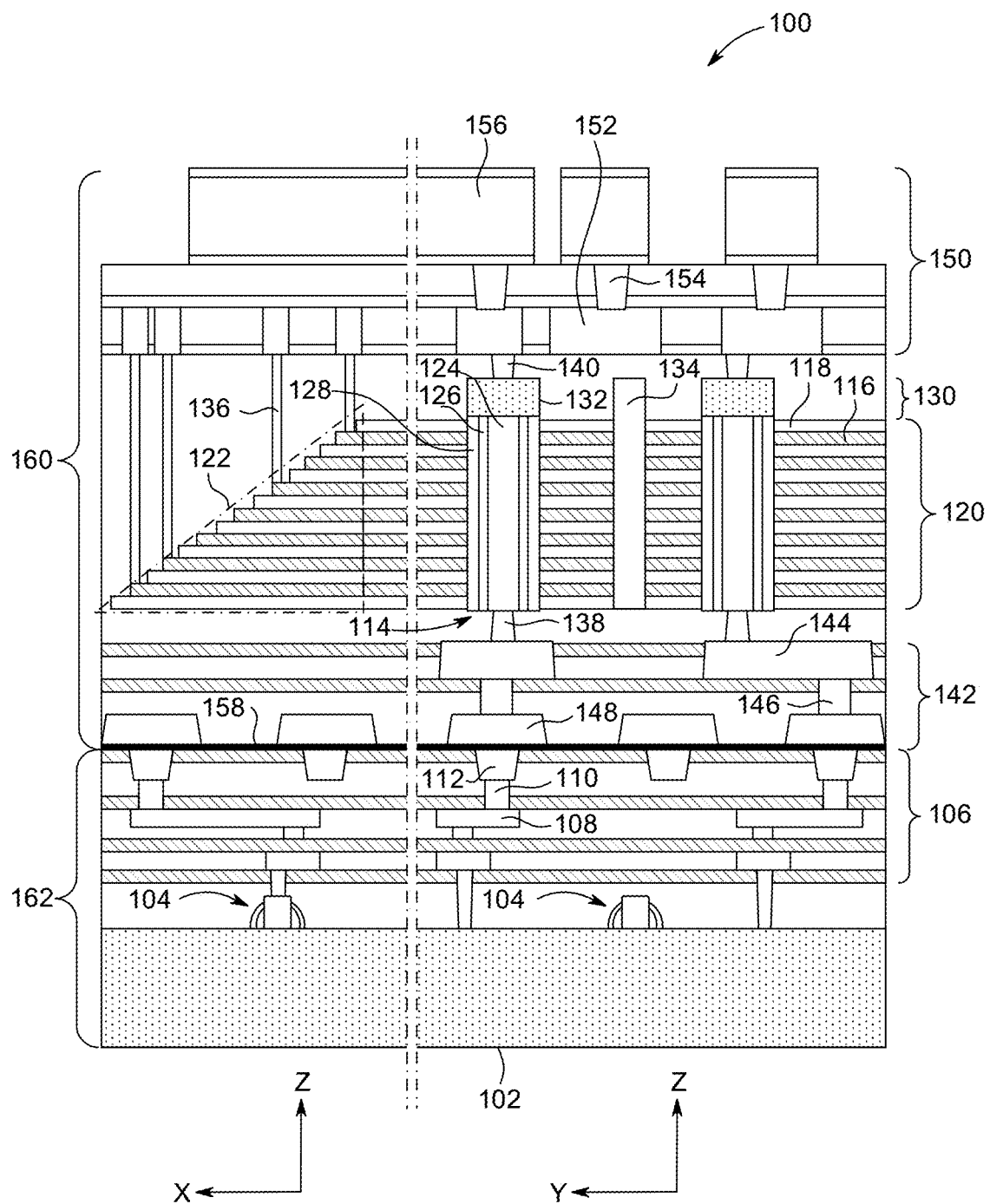
FIG. 1 is a schematic cross-sectional illustration of a 3D memory device, according to an exemplary aspect.

The features and exemplary aspects of the aspects will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more aspects that incorporate the features of this present invention. The disclosed aspect(s) merely exemplify the present invention. The scope of the invention is not limited to the disclosed aspect(s). The present invention is defined by the claims appended hereto.

The aspect(s) described, and references in the specification to "one aspect," "an aspect," "an example aspect," "an exemplary aspect," etc., indicate that the aspect(s) described may include a particular feature, structure, or characteristic, but every aspect may not necessarily include the particular feature, structure, or characteristic. Moreover, such phrases are not necessarily referring to the same aspect. Further, when a particular feature, structure, or characteristic is described in connection with an aspect, it is understood that it is within the knowledge of one skilled in the art to effect such feature, structure, or characteristic in connection with other aspects whether or not explicitly described.

Spatially relative terms, such as "beneath," "below," "lower," "above," "on," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "about" or "substantially" or "approximately" as used herein indicates the value of a given quantity that can vary based on a particular technology. Based on the particular technology, the term "about" or "substantially" or "approximately" can indicate a value of a given quantity that varies within, for example, 1-15% of the value (e.g., ±1%, ±2%, ±5%, ±10%, or ±15% of the value).

The term "dynamic random-access memory" or "DRAM" as used herein indicates a volatile memory that uses charge stored on a capacitor to represent information. DRAM stores each bit in a memory cell that includes a transistor and a capacitor (e.g., 1T1C). The 1T1C design can be based on metal-oxide-semiconductor (MOS) technology. Charge levels greater than a certain threshold can represent a first logic level (e.g., 1 state) and charge levels less than another threshold amount can represent a second logic level (e.g., 0 state). Leakage currents and various parasitic effects limit the length of time a capacitor can hold charge. Each time data is read, it must be rewritten to ensure retention and regular data refresh cycles must be performed. DRAM retention times can be as low as 32 ms during high temperature operations (e.g., greater than 85° C.) and can require refresh rates of about 31 Hz.

The term "flash memory" or "flash" as used herein indicates a non-volatile memory that uses charge stored on a floating gate to represent information. Flash stores each bit in a memory cell that includes a transistor with a floating gate. The amount of charge on the floating gate will determine whether the transistor will conduct when a fixed set of read bias conditions are applied. Flash can retain charge for a long period of time (e.g., about 10 years at 85° C.) since the floating gate is completely surrounded by insulators. Further, the act of reading the data can be performed non-destructively without loss of the information. In addition, flash can quickly erase data and entire blocks or pages of data can be erased simultaneously.

The term "NAND" as used herein indicates memory designs or architectures that resemble NAND logic gates (e.g., an inverted AND gate) and connect to memory cells in series (e.g., memory strings). In NAND flash, the relationship between a bit line and a word line resembles a NAND logic gate and can be used for fast writes and high-density arrays. NAND flash can access data sequentially since the transistors in the array are connected in series (e.g., memory strings). NAND flash can be read, programmed (written), and erased in blocks or pages. NAND flash can have a smaller cell size than DRAM but can require additional circuitry to implement.

The term "surrounding gate transistor" or "SGT" as used herein indicates a memory device that has a gate surrounding a channel region of a transistor on all sides.

The term "dynamic flash memory" or "DFM" as used herein indicates a volatile memory that uses a dual gate SGT. The dual gates of the dual gate SGT can include a word line (WL) gate and a plate line (PL) gate. DFM can be capacitor-free and can store charge on a channel region of a transistor. DFM can still requires a refresh cycle but can offer longer retention times, faster operation speeds, and higher density than compared to DRAM or other types of volatile memory. Further, similar to flash, DFM can offer block refresh and block erase operations.

The term "bit line" or "BL" as used herein indicates an array connection to address a particular memory cell in a memory array. A bit line can be connected to a drain of a transistor (e.g., DFM device). A bit line can be connected to two or more serially connected memory cells (e.g., memory strings). Different voltage combinations applied to the bit line can define read, program (write), and erase operations in the memory cell.

The term "source line" or "SL" as used herein indicates an array connection to address a particular memory cell in a memory array. A source line can be connected to a source of a transistor (e.g., DFM device). A source line can be connected to two or more serially connected memory cells (e.g., memory strings). Different voltage combinations applied to the source line can define read, program (write), and erase operations in the memory cell.

The term "word line" or "WL" as used herein indicates an array connection to provide a voltage to a particular memory cell in a memory array to select which row of bits is to be read, programmed, or erased. A word line can act as a top select gate (TSG). A word line can be connected to a portion of a channel or a portion of a body of a transistor (e.g., DFM device). Different voltage combinations applied to the word line can define read, program (write), and erase operations in the memory cell. When the word line is activated, current flows only if charge is already on the memory cell. If there is charge on the channel or body of the memory cell, the read operation recharges the memory cell and is non-destructive. If there is no charge on the channel or body of the memory cell, no current flows and the read is also non-destructive.

The term "plate line" or "PL" as used herein indicates an array connection to provide a voltage to a particular memory cell in a memory array to read, program, or erase charge on the memory cell. A plate line can be connected to a portion of a channel or a portion of a body of a transistor (e.g., DFM device). Different voltage combinations applied to the plate line can define read, program (write), and erase operations in the memory cell. When the plate line is activated, charge flows from the source line (source) to the bit line (drain). When the plate line is deactivated, any remaining charge is stored in the channel or body of the memory cell.

The term "substrate" as used herein indicates a planar wafer on which subsequent layers can be deposited, formed, or grown. A substrate can be formed of a single element (e.g., Si) or a compound material (e.g., GaAs), and may be doped or undoped. For example, a substrate can include silicon (Si), germanium (Ge), silicon-germanium (SiGe), gallium arsenide (GaAs), gallium nitride (GaN), gallium phosphide (GaP), gallium antimonide (GaSb), indium phosphide (InP), indium antimonide (InSb), a Group IV semiconductor, a Group III-V semiconductor, a Group II-VI semiconductor, graphene, sapphire, and/or any other semiconductor material. A substrate can be a monocrystalline material (e.g., monocrystalline Si).

The term "Group III-V semiconductor" as used herein indicates comprising one or more materials from Group III of the periodic table (e.g., group 13 elements: boron (B), aluminum (Al), gallium (Ga), indium (In), thallium (Tl)) with one or more materials from Group V of the periodic table (e.g., group 15 elements: nitrogen (N), phosphorus (P), arsenic (As), antimony (Sb), bismuth (Bi)). The compounds have a 1:1 combination of Group III and Group V regardless of the number of elements from each group. Subscripts in chemical symbols of compounds refer to the proportion of that element within that group. For example, $Al_{0.25}GaAs$ means the Group III part comprises 25% Al, and thus 75% Ga, while the Group V part comprises 100% As.

The term "Group IV semiconductor" as used herein indicates comprising two or more materials from Group IV of the periodic table (e.g., group 14 elements: carbon (C), silicon (Si), germanium (Ge), tin (Sn), lead (Pb)). Subscripts in chemical symbols of compounds refer to the proportion of that element. For example, $Si_{0.25}Ge0.75$ means the Group IV part comprises 25% Si, and thus 75% Ge.

The term "Group II-VI semiconductor" as used herein indicates comprising one or more materials from Group II of the periodic table (e.g., group 12 elements: zinc (Zn), cadmium (Cd), mercury (Hg)) with one or more materials from Group VI of the periodic table (e.g., group 16 elements: oxygen (O), sulfur (S), selenium (Se), tellurium (Te)). The compounds have a 1:1 combination of Group II and Group VI regardless of the number of elements from each group. Subscripts in chemical symbols of compounds refer to the proportion of that element within that group.

The term "doping" or "doped" as used herein indicates that a layer or material contains a small impurity concentration of another element (dopant) which donates (donor) or extracts (acceptor) charge carriers from the parent material and therefore alters the conductivity. Charge carriers may be electrons or holes. A doped material with extra electrons is called n-type while a doped material with extra holes (fewer electrons) is called p-type.

The term "crystalline" as used herein indicates a material or layer with a single crystal orientation. In epitaxial growth or deposition, subsequent layers with the same or similar lattice constant follow the registry of the previous crystalline layer and therefore grow with the same crystal orientation or crystallinity.

The term "monocrystalline" as used herein indicates a material or layer having a continuous crystal lattice throughout the material or layer. Monocrystalline can indicate a single crystal or monocrystal (e.g., Si, Ge, GaAs, etc.).

The term "monolithic" as used herein indicates a layer, element, or substrate comprising bulk (e.g., single) material throughout. A monolithic element (e.g., a pillar) can be formed from a single bulk material (e.g., Si).

The term "deposit" or "deposition" as used herein indicates the depositing or growth of a layer on another layer or substrate. Deposition can encompass vacuum deposition, thermal evaporation, arc vaporization, ion beam deposition, e-beam deposition, sputtering, laser ablation, pulsed laser deposition (PLD), physical vapor deposition (PVD), atomic layer deposition (ALD), chemical vapor deposition (CVD), plasma-enhanced CVD (PECVD), low pressure CVD (LPCVD), metal-organic chemical vapor deposition (MOCVD), liquid source misted chemical deposition, spin-coating, epitaxy, vapor-phase epitaxy (VPE), liquid-phase epitaxy (LPE), solid-phase epitaxy (SPE), MBE, atomic layer epitaxy (ALE), molecular-beam epitaxy (MBE), powder bed deposition, and/or other known techniques to deposit material in a layer.

The term "dielectric" as used herein indicates an electrically insulating layer. Dielectric can encompass oxide, nitride, oxynitride, ceramic, glass, spin-on-glass (SOG), polymer, plastic, thermoplastic, resin, laminate, high-k dielectric, and/or any other electrically insulating material.

The term "high-k dielectric" as used herein indicates a material with a high dielectric constant k or κ (kappa), for example, relative to the dielectric constant of silicon dioxide ($SiO_2$). High-k dielectrics can be used as a gate dielectric or as another dielectric layer in an electronic device.

The term "high-k metal gate" or "high-k dielectric and conductive gate" or "HKMG" as used herein indicates a process of forming a high-k dielectric layer and a conductive (metal) layer stack in a memory device. HKMG technology can reduce gate leakage, increase transistor capacitance, and provide low power consumption for devices. Two process flows to pattern the HKMG stack are gate-first and gate-last.

The term "epitaxy" or "epitaxial" or "epitaxially" as used herein indicates crystalline growth of material, for example, via high temperature deposition.

The term "selective epitaxial growth" or "SEG" as used herein indicates local growth of an epitaxial layer through a pattern mask on a substrate or a layer. SEG provides epitaxial growth only on the exposed substrate or layer and other regions are masked by a dielectric film or other material that is not reactive to epitaxy.

The term "alternating dielectric stack" as used herein indicates a stack of different alternating dielectric layers in succession. For example, the first dielectric layer can be an oxide (e.g., silicon oxide) and the second dielectric layer can be a nitride (e.g., silicon nitride). The alternating dielectric stack can be arranged in a staircase pattern.

The term "gate line trench" as used herein indicates a trench or hole extending through an alternating dielectric stack of a memory device. The gate line trench can be used to form a gate line slit in the memory device.

The term "gate line slit" or "GLS" as used herein indicates a conductive pathway through an alternating dielectric stack, for example, between adjacent memory blocks or adjacent memory cells. The GLS can provide connection to a HKMG stack in a memory device. The GLS can extend vertically through the alternating dielectric stack and extend horizontally between two adjacent arrays of memory blocks or memory cells.

The term "HIGH level voltage" or "HIGH" as used herein indicates an applied voltage not equal to zero (e.g., ±1 V) for a "high" logic state. In some aspects, HIGH level voltage indicates an acceptable input signal voltage range from about 0.8 V to about 5 V for a "high" logic state. In some aspects, HIGH level voltage indicates an acceptable input signal voltage range from about −0.8 V to about −5 V for a "high" logic state.

The term "LOW level voltage" or "LOW" as used herein indicates an applied voltage equal to or greater than zero (e.g., 0 V) for a "low" logic state. In some aspects, LOW level voltage indicates an acceptable input signal voltage range from about 0 V to about 0.8 V for a "low" logic state.

The term "GND" as used herein indicates a ground voltage level (e.g., 0 V).

Aspects of the disclosure may be implemented in hardware, firmware, software, or any combination thereof. Aspects of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; dynamic flash memory (DFM) devices, electrical, optical, acoustical or other forms of propagated signals (e.g., carrier waves, infrared signals, digital signals, etc.), and others. Further, firmware, software, routines, and/or instructions may be described herein as performing certain actions. However, it should be appreciated that such descriptions are merely for convenience and that such actions in fact result from computing devices, processors, controllers, or other devices executing the firmware, software, routines, instructions, etc.

Before describing such aspects in more detail, however, it is instructive to present example environments in which aspects of the present disclosure may be implemented.

Exemplary 3D Memory Device

FIG. 1 is a schematic cross-sectional illustration of 3D memory device 100, according to an exemplary aspect. 3D memory device 100 can be configured to increase storage density and incorporate a memory array and peripheral devices for controlling signals to and from the memory array. Although 3D memory device 100 is shown in FIG. 1 as a stand-alone apparatus and/or system, the aspects of this disclosure can be used with other apparatuses, systems, and/or methods, such as, but not limited to, dual gate SGT device 200, DFM device 300, multi-cell DFM device 500, manufacturing method 1200, and/or flow diagram 1300.

As shown in FIG. 1, 3D memory device 100 can include substrate 102, memory array 160, and peripheral device 162. Memory array 160 can include memory stack 120, semiconductor layer 130, array interconnect layer 142, and back-end-of-line (BEOL) interconnect layer 150. Peripheral device 162 can include substrate 102, plurality of transistors 104, and interconnect layer 106. 3D memory device 100 represents an example of a non-monolithic 3D memory device, in which components of the 3D memory device 100 (e.g., peripheral devices and memory arrays) can be formed separately on different substrates and then joined to from 3D memory device 100. This is described in further detail in U.S. Pat. No. 10,867,678, which is incorporated by reference herein in its entirety.

3D memory device 100 can include substrate 102, for example, silicon (e.g., single crystalline silicon), silicon-germanium (SiGe), gallium arsenide (GaAs), germanium (Ge), silicon on insulator (SOI), or any other suitable materials. 3D memory device 100 can include peripheral device 162 on substrate 102. Peripheral device 162 can be formed "on" substrate 102, where the entirety or part of peripheral device 162 is formed in substrate 102 (e.g., below the top surface of substrate 102) and/or directly on substrate 102. Peripheral device 162 can include transistors 104 formed on substrate 102. Isolation regions (e.g., shallow trench isolations (STIs)) and doped regions (e.g., source regions and drain regions of transistors 104) can be formed in substrate 102 as well. In some aspects, peripheral device 162 can be formed on substrate 102 using complementary metal-oxide-semiconductor (CMOS) technology.

3D memory device 100 can include interconnect layer 106 above transistors 104 to transfer electrical signals to and from transistors 104. Interconnect layer 106 can include a plurality of interconnects (also referred to herein as "contacts"), including interconnect lines 108 and vertical interconnect access (via) contacts 110. As used herein, the term "interconnects" can broadly include any suitable types of interconnects, such as front-end-of-line (FEOL) interconnects, middle-end-of-line (MEOL) interconnects, and/or BEOL interconnects.

Interconnect layer 106 can further include one or more interlayer dielectric (ILD) layers (also known as "intermetal dielectric (IMD) layers") in which interconnect lines 108 and via contacts 110 can form. That is, interconnect layer 106 can include interconnect lines 108 and via contacts 110 in multiple ILD layers. Interconnect lines 108 and via contacts 110 in interconnect layer 106 can include conductive materials including, but not limited to, tungsten (W), cobalt (Co), copper (Cu), aluminum (Al), silicides, or any combination thereof. The ILD layers in interconnect layer 106 can include dielectric materials including, but not limited to, silicon oxide, silicon nitride, silicon oxynitride, low dielectric constant (low-k) dielectrics, or any combination thereof.

In some aspects, interconnect layer 106 can further include bonding contacts 112 at the top surface of interconnect layer 106. Bonding contacts 112 can include conductive materials including, but not limited to, W, Co, Cu, Al, silicides, or any combination thereof. The remaining areas at the top surface of interconnect layer 106 can be formed with dielectric materials including, but not limited to, silicon oxide, silicon nitride, silicon oxynitride, low-k dielectrics, or any combination thereof. Conductive materials (e.g., of bonding contacts 112) and dielectric materials at the top surface of interconnect layer 106 can be used for hybrid bonding as described below in detail.

3D memory device 100 can include memory array 160 above peripheral device 162. It is noted that X, Y, and Z axes are shown in FIG. 1 to further illustrate the spatial relationship of the components in 3D memory device 100. Substrate 102 includes two lateral surfaces (e.g., a top surface and a bottom surface) extending laterally in the X- and Y-directions (i.e., the lateral or width directions). As used herein, whether one component (e.g., a layer or a device) is "on," "above," or "below" another component (e.g., a layer or a device) of a semiconductor device (e.g., 3D memory device 100) is determined relative to the substrate of the semiconductor device (e.g., substrate 102) in the Z-direction (i.e., the vertical or thickness direction) when the substrate is positioned in the lowest plane of the semiconductor device in the Z-direction. The same notion for describing spatial relationship is applied throughout the present disclosure.

In some aspects, 3D memory device 100 is a NAND flash memory device in which memory cells are provided in the form of an array of NAND memory strings 114 each extending vertically above peripheral device 162 (e.g., transistors 104) and substrate 102. Memory array 160 can include NAND memory strings 114 that extend vertically through a plurality of alternating conductive/dielectric layer pairs, each including conductor layer 116 and dielectric layer 118. The stacked conductor/dielectric layer pairs are also referred to herein as memory stack 120. Conductor layers 116 and dielectric layers 118 in memory stack 120 alternate in the vertical direction. In other words, except at the top or bottom of memory stack 120, each conductor layer 116 can be adjoined by two dielectric layers 118 on both sides, and each dielectric layer 118 can be adjoined by two conductor layers 116 on both sides. Conductor layers 116 can each have the same thickness or different thicknesses. Similarly, dielectric layers 118 can each have the same thickness or different thicknesses. Conductor layers 116 can include conductive materials including, but not limited to, W, Co, Cu, Al, doped silicon, silicides, or any combination thereof. Dielectric layers 118 can include dielectric materials including, but not limited to, silicon oxide, silicon nitride, silicon oxynitride, or any combination thereof.

Memory stack 120 can include an inner region (also known as a "core array region") and an outer region (also known as a "staircase region"). In some aspects, the inner region is the center region of memory stack 120 where NAND memory strings 114 are formed, and the outer region is the remaining region of memory stack 120 surrounding the inner region (including the sides and edges). As shown in FIG. 1, at least on one lateral side, the outer region of memory stack 120 can include staircase structure 122. The edges of the conductor/dielectric layer pairs in staircase structure 122 of memory stack 120 along the vertical direction away from substrate 102 (the positive Z-direction) are staggered laterally toward NAND memory strings 114. In other words, the edges of memory stack 120 in staircase structure 122 can be tilted toward the inner region as moving away from substrate 102 (from bottom to top). The slope of staircase structure 122 can face away from substrate 102. In some aspects, the length of each conductor/dielectric layer pair of memory stack 120 increases from the top to the bottom.

In some aspects, each two adjacent conductor/dielectric layer pairs in staircase structure 122 are offset by a nominally same distance in the vertical direction (Z-direction) and a nominally same distance in the lateral direction (X-direction). Each offset thus can form a "landing area" for word line fan-out in the vertical direction. Some conductor layers 116 in the conductor/dielectric layer pairs can function as word lines of 3D memory device 100 and extend laterally into staircase structure 122 for interconnection. As shown in FIG. 1, the offset of the edges of each adjacent conductor/dielectric layer pairs in staircase structure 122 is nominally the same, according to some aspects.

As shown in FIG. 1, each NAND memory string 114 can extend vertically through the inner region of memory stack 120 and include semiconductor channel 124 and a dielectric layer (also known as a "memory film"). In some aspects, semiconductor channel 124 includes silicon, such as amorphous silicon, polysilicon, or single crystalline silicon. In some aspects, the memory film is a composite layer including tunneling layer 126, storage layer 128 (also known as a "charge trap/storage layer"), and a blocking layer. Each NAND memory string 114 can have a cylindrical shape (e.g., a pillar shape). Semiconductor channel 124, tunneling layer 126, storage layer 128, and a blocking layer are arranged radially from the center toward the outer surface of the pillar in this order, according to some aspects. Tunneling layer 126 can include silicon oxide, silicon oxynitride, or any combination thereof. Storage layer 128 can include silicon nitride, silicon oxynitride, silicon, or any combination thereof. The blocking layer can include silicon oxide, silicon oxynitride, high dielectric constant (high-k) dielectrics, or any combination thereof.

In some aspects, NAND memory strings 114 further include a plurality of control gates (each being part of a word line). Each conductor layer 116 in memory stack 120 can act as a control gate for each memory cell of NAND memory string 114. Each NAND memory string 114 can include a source select gate at its upper end and a drain select gate at its lower end. As used herein, the "upper end" of a component (e.g., NAND memory string 114) is the end farther away from substrate 102 in the Z-direction, and the "lower end" of the component (e.g., NAND memory string 114) is the end closer to substrate 102 in the Z-direction. For each NAND memory string 114, the drain select gate can be disposed below the source select gate in 3D memory device 100.

In some aspects, 3D memory device 100 further includes semiconductor layer 130 disposed above and in contact with NAND memory strings 114, for example, on the upper end of each NAND memory string 114. Memory stack 120 can be disposed below semiconductor layer 130. Semiconductor layer 130 can be a thinned substrate on which memory stack 120 is formed. In some aspects, semiconductor layer 130 includes semiconductor plugs 132 electrically separated by isolation regions (e.g., STIs). In some aspects, each semiconductor plug 132 is disposed at the upper end of corresponding NAND memory string 114 and functions as the source of corresponding NAND memory string 114 and thus, can be considered as part of corresponding NAND memory string 114. Semiconductor plug 132 can include single crystalline silicon. Semiconductor plug 132 can be undoped, partially doped (in the thickness direction and/or the width direction), or fully doped by p-type or n-type dopants. In some aspects, semiconductor plug 132 can include SiGe, GaAs, Ge, or any other suitable materials.

In some aspects, 3D memory device 100 can further include gate line slit (GLS) 134 that extends vertically in the Z-direction through memory stack 120. GLS 134 can extend along the X-direction which is parallel to staircase structure 122 extending along the X-direction. FIG. 1 shows a cross-sectional view of GLS 134 along the YZ-plane and a separate (orthogonal) cross-sectional view of staircase structure 122 along the XZ-plane. GLS 134 can be used to form the conductor/dielectric layer pairs in memory stack 120 by a gate replacement process. In some aspects, GLS 134 is first filled with dielectric materials, for example, silicon oxide, silicon nitride, or any combination thereof, for separating NAND memory strings 114 into different regions (e.g., memory fingers and/or memory blocks). Then, GLS 134 can be filled with conductive and/or semiconductor materials, for example, W, Co, polysilicon, or any combination thereof, for electrically controlling an array common source (ACS), according to some aspects.

In some aspects, 3D memory device 100 can include local interconnects that are formed in one or more ILD layers and in contact with components in memory stack 120, such as the word lines (e.g., conductor layers 116) and NAND memory strings 114. The interconnects are referred to herein as "local interconnects" as they are in contact with the components in memory stack 120 directly for fan-out. The local interconnects can include word line contacts 136, bit line contacts 138, and source line contacts 140. Each local interconnect can include an opening (e.g., a via hole or a trench) filled with conductive materials including, but not limited to, W, Co, Cu, Al, silicides, or any combination thereof.

Word line contacts 136 can extend vertically through one or more ILD layers. Each word line contact 136 can have its lower end in contact with corresponding conductor layer 116 (e.g., at the landing area) in staircase structure 122 of memory stack 120 to individually address a corresponding word line of 3D memory device 100. In some aspects, each word line contact 136 is disposed above corresponding conductor layer 116. Each bit line contact 138 can be disposed below memory stack 120 and have its upper end in contact with the lower end (e.g., the drain end) of corresponding NAND memory string 114 to individually address corresponding NAND memory string 114. Multiple bit line contacts 138 are disposed below and in contact with multiple NAND memory strings 114, respectively, according to some aspects. As shown in FIG. 1, word line contacts 136 and bit line contacts 138 fan-out the corresponding memory stack components toward opposite vertical directions (the positive and negative Z-directions). Source line contacts 140 can extend vertically through one or more ILD layers. Each source line contact 140 can have its lower end in contact with corresponding semiconductor plug 132 (e.g., the source) of NAND memory string 114. In some aspects, each source line contact 140 is disposed above corresponding NAND memory string 114.

Similar to peripheral device 162, memory array 160 of 3D memory device 100 can also include interconnect layers for transferring electrical signals to and from NAND memory strings 114. As shown in FIG. 1, 3D memory device 100 can include array interconnect layer 142 below NAND memory strings 114. Array interconnect layer 142 can include a plurality of interconnects, including array interconnect lines 144 and array via contacts 146 in one or more ILD layers. In some aspects, array interconnect layer 142 includes array bonding contacts 148 at its bottom surface. Array interconnect lines 144, array via contacts 146, and array bonding contacts 148 can include conductive materials including, but not limited to, W, Co, Cu, Al, silicides, or any combination thereof. The remaining areas at the bottom surface of array interconnect layer 142 can be formed with dielectric materials including, but not limited to, silicon oxide, silicon nitride, silicon oxynitride, low-k dielectrics, or any combination thereof. Conductive materials (of array bonding contacts 148) and dielectric materials at the bottom surface of array interconnect layer 142 can be used for hybrid bonding as described below in detail.

As shown in FIG. 1, BEOL interconnect layer 150 can be disposed above NAND memory strings 114 and semiconductor layer 130 and can include interconnects, such as BEOL interconnect lines 152 and BEOL via contacts 154 in one or more ILD layers. BEOL interconnect layer 150 can further include BEOL contact pads 156 and a redistribution layer at the top surface of 3D memory device 100 for wire bonding and/or bonding with an interposer. BEOL interconnect layer 150 and array interconnect layer 142 can be formed at opposite sides of NAND memory strings 114. In some aspects, BEOL interconnect lines 152, BEOL via contacts 154, and BEOL contact pads 156 in BEOL interconnect layer 150 can transfer electrical signals between 3D memory device 100 and external circuits. BEOL interconnect layer 150 can be electrically connected to memory stack 120 by the local interconnects. As shown in FIG. 1, each word line contact 136 can have its upper end in contact with BEOL interconnect layer 150. Similarly, each source line contact 140 can have its upper end in contact with BEOL interconnect layer 150. The arrangement and configuration of staircase structure 122 and semiconductor layer 130 allow direct fan-out of the word lines (e.g., conductor layers 116) and the sources of NAND memory strings 114 through the local interconnects (e.g., word line contacts 136 and source line contacts 140) and BEOL interconnect layer 150 without detouring through array interconnect layer 142.

In some aspects, 3D memory device 100 further includes one or more through array contacts (TACs) that extend vertically through memory stack 120. Each TAC can extend through the entirety of memory stack 120, (e.g., all the conductor/dielectric layer pairs therein) and have its upper end in contact with BEOL interconnect layer 150 and its lower end in contact with array interconnect layer 142. TACs can thus make electrical connections between interconnect layer 106 and BEOL interconnect layer 150 and carry electrical signals from peripheral device 162 to BEOL interconnect layer 150 of 3D memory device 100.

Bonding interface 158 can be formed between interconnect layer 106 and array interconnect layer 142. Bonding contacts 112 and be bonded with array bonding contacts 148 at bonding interface 158. As shown in FIG. 1, peripheral device 162 (e.g., transistors 104) can be disposed below memory array 160 (e.g., NAND memory strings 114) in 3D memory device 100 after bonding. In 3D memory device 100, bonding interface 158 is disposed between memory array 160 (e.g., NAND memory strings 114) and peripheral device 162 (e.g., transistors 104), according to some aspects. Interconnect layer 106 can be between bonding interface 158 and peripheral device 162 (e.g., transistors 104), and array interconnect layer 142 can be between bonding interface 158 and memory array 160 (e.g., NAND memory strings 114).

In some aspects, a first semiconductor structure (e.g., memory array 160), including NAND memory strings 114, semiconductor layer 130 (e.g., a thinned substrate), array interconnect layer 142, BEOL interconnect layer 150, and word line contacts 136, can be bonded to a second semiconductor structure (e.g., peripheral device 162), including substrate 102, transistors 104, and interconnect layer 106, in a face-to-face manner at bonding interface 158. Array interconnect layer 142 can contact interconnect layer 106 at bonding interface 158. Peripheral device 162 and memory array 160 can be bonded using hybrid bonding (also known as "metal/dielectric hybrid bonding"), which is a direct bonding technology (e.g., forming bonding between surfaces without using intermediate layers, such as solder or adhesives) and can obtain metal-metal bonding and dielectric-dielectric bonding simultaneously. The metal-metal bonding can be formed between array bonding contacts 148 and bonding contacts 112, and the dielectric-dielectric bonding can be formed between the dielectric materials at the remaining areas at bonding interface 158.

Exemplary Dual Gate Surrounding Gate Transistor (SGT) Device

Figure 2:
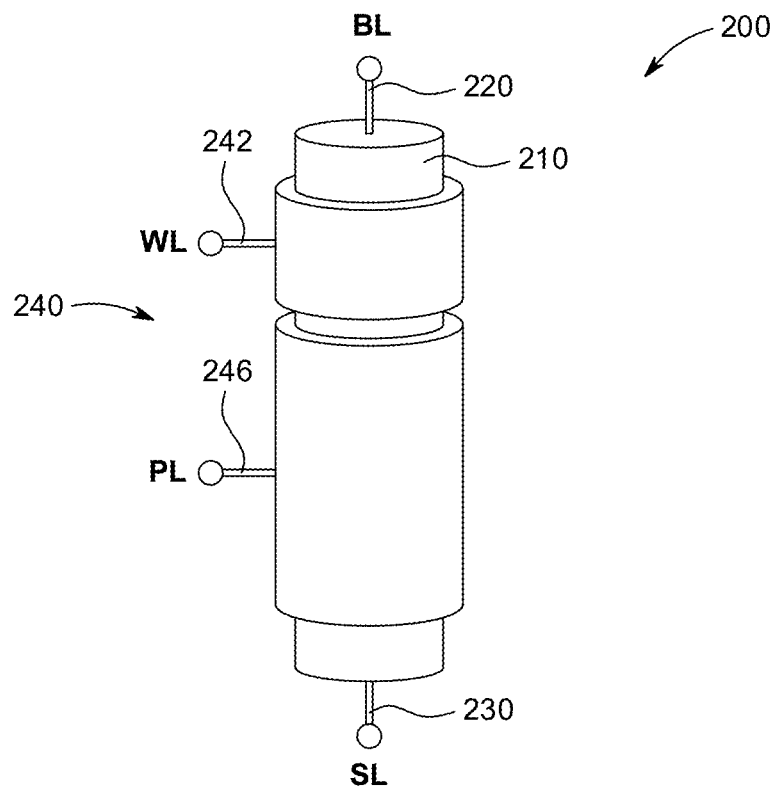
FIG. 2 is a schematic perspective illustration of a dual gate SGT device, according to an exemplary aspect.

FIG. 2 is a schematic perspective illustration of dual gate SGT device 200, according to an exemplary aspect. Dual gate SGT device 200 can be configured to provide two gates (e.g., word line 242 and plate line 246) surrounding a channel region (e.g., pillar 210) on all sides. Dual gate SGT device 200 can be further configured to operate as a volatile capacitor-free 3D memory device. Although dual gate SGT device 200 is shown in FIG. 2 as a stand-alone apparatus and/or system, the aspects of this disclosure can be used with other apparatuses, systems, and/or methods, such as, but not limited to, 3D memory device 100, DFM device 300, multi-cell DFM device 500, manufacturing method 1200, and/or flow diagram 1300.

As shown in FIG. 2, dual gate SGT device 200 can include pillar 210, bit line (BL) 220, source line (SL) 230, and SGT cell 240. Pillar 210 can be configured to store charge (e.g., holes). BL 220 can be configured to address pillar 210 in dual gate SGT device 200 and act as a drain connection to pillar 210. SL 230 can be configured to address pillar 210 in dual gate SGT device 200 and act as a source connection to pillar 210. SGT cell 240 can be configured to address pillar 210 in dual gate SGT device 200 and act as a gate connection to pillar 210. In some aspects, different voltage combinations applied to BL 220, SL 230, and SGT cell 240 can define read, program (write), and erase operations in dual gate SGT device 200.

SGT cell 240 can include word line (WL) 242 and plate line (PL) 246. WL 242 can be configured to address pillar 210 in dual gate SGT device 200 and act as a first gate connection to pillar 210. In some aspects, WL 242 can act as a top select gate connection. In some aspects, WL 242 can provide a voltage to read, program, or erase charge on pillar 210. PL 246 can be configured to address pillar 210 in dual gate SGT device 200 and act as a second gate connection of pillar 210. In some aspects, PL 246 can act as a traditional current-valve gate (e.g., similar to a metal-oxide-semiconductor field-effect transistor (MOSFET) gate) for pillar 210 and cover a majority of a length of pillar 210. In some aspects, PL 246 can provide a voltage to read, program, or erase charge on pillar 210. In some aspects, dual gate SGT device 200 can form part of DFM device 300 shown in FIG. 3.

Exemplary Dynamic Flash Memory (DFM) Device

Figure 3:
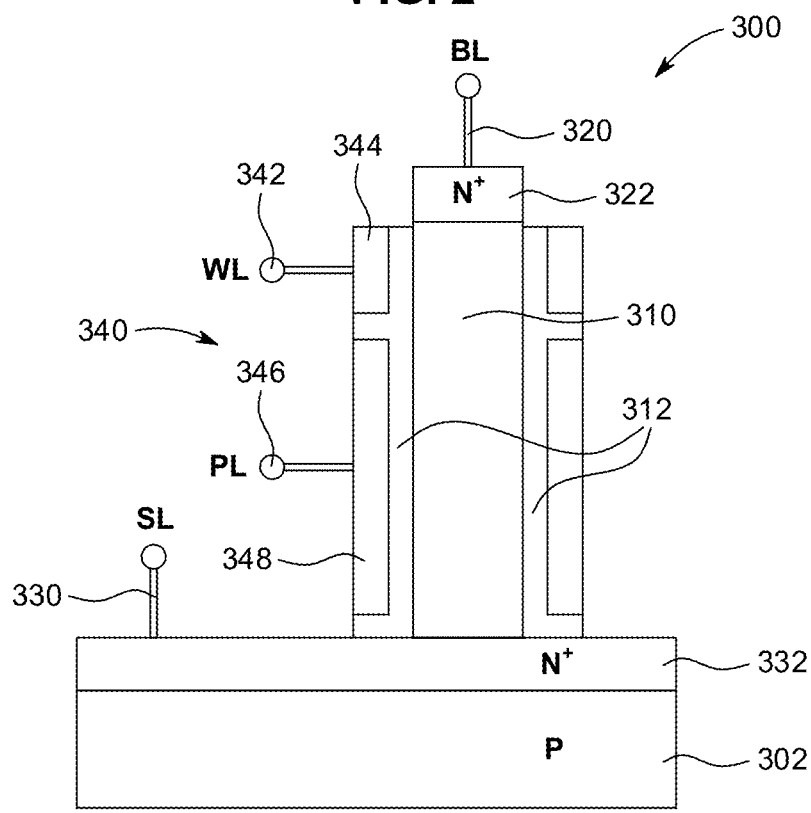
FIG. 3 is a schematic cross-sectional illustration of a DFM device, according to an exemplary aspect.
Figure 4:
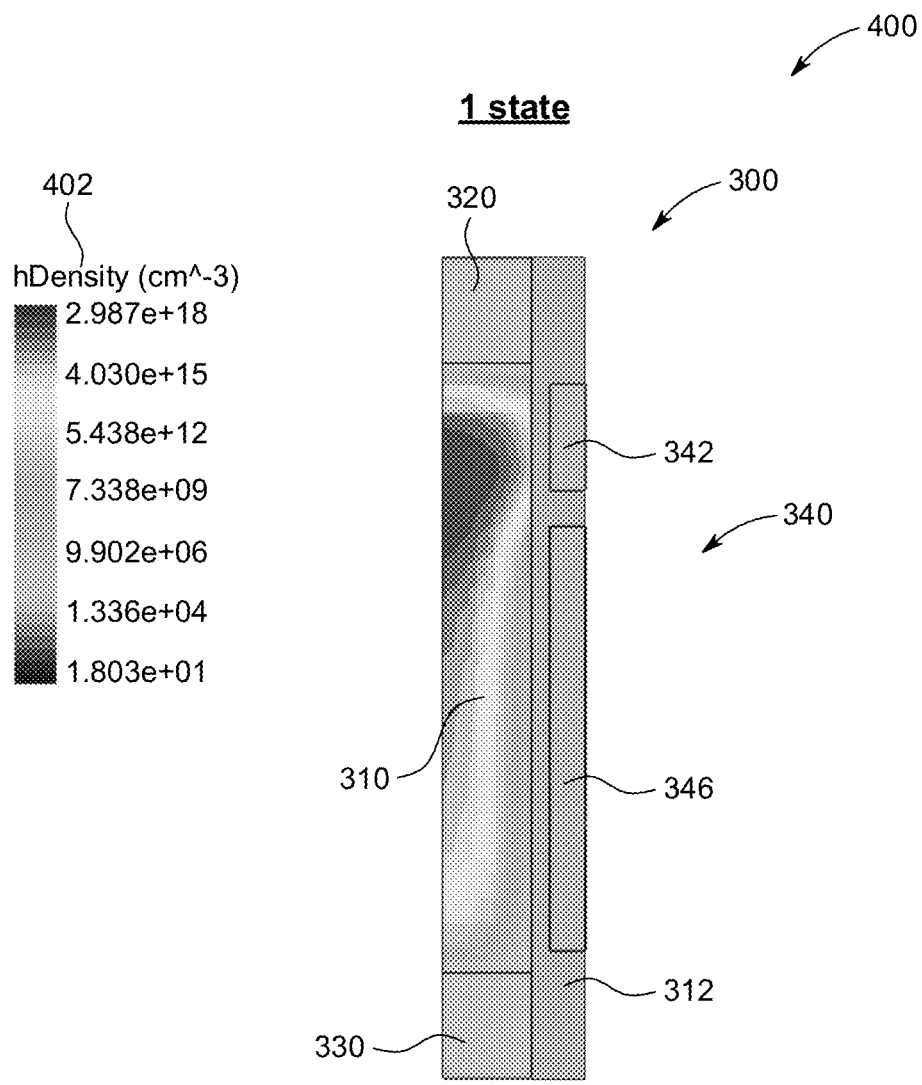
FIG. 4 is a schematic cross-sectional illustration of a charge density distribution of the DFM device shown in FIG. 3 for a program state, according to an exemplary aspect.

FIGS. 3 and 4 illustrate DFM device 300, according to exemplary aspects. FIG. 3 is a schematic cross-sectional illustration of DFM device 300, according to an exemplary aspect. FIG. 4 is a schematic cross-sectional illustration of charge density distribution 400 of DFM device 300 shown in FIG. 3 for a program state (1 state), according to an exemplary aspect. DFM device 300 can be configured to include dual gate SGT device 200 in a vertical arrangement on substrate 302 and operate as a volatile capacitor-free 3D memory device. DFM device 300 can be further configured to provide faster operation speeds and higher density than DRAM or other types of volatile memory. DFM device 300 can be further configured to provide block refresh and block erase operations similar to flash memory functionality. Although DFM device 300 is shown in FIGS. 3 and 4 as a stand-alone apparatus and/or system, the aspects of this disclosure can be used with other apparatuses, systems, and/or methods, such as, but not limited to, 3D memory device 100, dual gate SGT device 200, multi-cell DFM device 500, manufacturing method 1200, and/or flow diagram 1300.

As shown in FIG. 3, DFM device 300 can include substrate 302, pillar 310, dielectric 312, bit line (BL) 320, BL contact 322, source line (SL) 330, SL contact 332, and DFM cell 340. Substrate 302 can be configured to support pillar 310, dielectric 312, BL contact 322, SL contact 332, and DFM cell 340. Substrate 302 can be coupled to SL contact 332. In some aspects, substrate 302 can be a p-type semiconductor (e.g., p), for example, doped silicon. Pillar 310 can be configured to store charge (e.g., holes). Pillar 310 can be between BL contact 322 and SL contact 332. Dielectric 312 can surround pillar 310 and be configured to provide electrical insulation between pillar 310 and DFM cell 340 (e.g., word line contact 344 and plate line contact 346). In some aspects, dielectric 312 can be a high-k dielectric configured to increase a gate capacitance and decrease a leakage current in pillar 310.

BL 320 can be configured to address pillar 310 in DFM device 300 and be coupled to BL contact 322. BL contact 322 can be configured to act as a drain connection to pillar 310. In some aspects, BL contact 322 can be n-type (e.g., n+) and pillar 310 can be p-type (e.g., p). SL 330 can be configured to address pillar 310 in DFM device 300 and be coupled to SL contact 332. SL contact 332 can be configured to act as a source connection to pillar 310. In some aspects, SL contact 332 can be n-type (e.g., n+) and pillar 310 can be p-type (e.g., p). DFM cell 340 can be configured to address pillar 310 in DFM device 300 and act as a gate connection to pillar 310. In some aspects, different voltage combinations applied to BL 320, SL 330, and DFM cell 340 can define read, program (write), and erase operations in DFM device 300.

DFM cell 340 can include word line (WL) 342, WL contact 344, plate line (PL) 346, and PL contact 348. WL 342 can be configured to address pillar 310 in DFM device 300 and be coupled to WL contact 344. WL contact 344 can be configured to act as a first gate connection to pillar 310. WL contact 344 can surround dielectric 312 which surrounds pillar 310 thereby forming a first concentric transistor. In some aspects, WL contact 344 can include a conductive material (e.g., metal, polysilicon, tungsten, etc.). In some aspects, WL 342 can act as a top select gate connection. In some aspects, WL 342 can provide voltage to WL contact 344, thereby inducing an electric field within pillar 310, to read, program, or erase charge on pillar 310.

PL 346 can be configured to address pillar 310 in DFM device 300 and be coupled to PL contact 348. PL contact 348 can be configured to act as a second gate connection to pillar 310. PL contact 348 can surround dielectric 312 which surrounds pillar 310 thereby forming a second concentric transistor. In some aspects, PL contact 348 can include a conductive material (e.g., metal, polysilicon, tungsten, etc.). In some aspects, PL 346 can act as a traditional current-valve gate (e.g., similar to a MOSFET gate) for pillar 310 and cover a majority of a length of pillar 310. In some aspects, PL 346 can provide voltage to PL contact 348, thereby inducing an electric field within pillar 310, to read, program, or erase charge on pillar 310.

As shown in FIG. 4, charge density distribution 400 shows charge (e.g., hole) density 402 within DFM device 300 for a program state (1 state) after 100 ms at an operating temperature of 85° C. Charge density distribution 400 can include charge (e.g., hole) density 402, which can range from about $1.8 \times 10^1$ $cm_{-3}$ to about $3 \times 10^{18}$ $cm_{-3}$. The program state (1 state) represents a program (write) operation on DFM device 300, whereby different voltage combinations applied to BL 320, SL 330, WL 342, and PL 346 form charge (e.g., holes) on pillar 310 of DFM device 300. In some aspects, as shown in FIG. 4, in the 1 state, only a small portion of pillar 310 retains charge of at least $1 \times 10^{17}$ $cm_{-3}$ after 100 ms at an operating temperature of 85° C. For example, a portion of pillar 310 adjacent PL contact 346 retains charge no greater than $1 \times 10^{17}$ $cm_{-3}$.

Exemplary Multi-Cell DFM Device

As discussed above, DRAM is a volatile memory that uses charge stored on a capacitor to represent information. DRAM stores each bit in a memory cell that includes a transistor and a capacitor (e.g., 1T1C). Charge levels greater than a certain threshold can represent a first logic level (e.g., 1 state) and charge levels less than another threshold amount can represent a second logic level (e.g., 0 state). Leakage currents and various parasitic effects limit the length of time a capacitor can hold charge. Each time data is read, it must be rewritten to ensure retention and regular data refresh cycles must be performed. DRAM retention times can be as low as 32 ms during high temperature operations (e.g., greater than 85° C.) and can require refresh rates of about 31 Hz.

Flash is a non-volatile memory that uses charge stored on a floating gate to represent information. Flash stores each bit in a memory cell that includes a transistor with a floating gate. The amount of charge on the floating gate will determine whether the transistor will conduct when a fixed set of read bias conditions are applied. Flash can retain charge for a long period of time since the floating gate is completely surrounded by insulators. Further, the act of reading the data can be performed non-destructively without loss of the information. In addition, flash can quickly erase entire blocks or pages of data simultaneously (e.g., NAND flash).

Current 1T1C DRAM is approaching a process limit. The manufacturing of 1T1C DRAM devices with small-node capacitors to retain charge is becoming more difficult due to increased current leakage, increased power consumption, degraded operating voltage margins, and decreased retention times. Further, current single transistor (1T) capacitor-free DRAM (e.g., ZRAM, TTRAM, ARAM, etc.) devices need further improvement and optimization for manufacturable integration and operation solutions. Current 1T DRAM devices have serious problems due to junction leakage and large capacitive coupling between word lines and the transistor floating body. In addition, current 1T DRAM devices have extremely narrow operational voltage margins between first and second logic levels (e.g., 1 state and 0 state).

Aspects of multi-cell DFM apparatuses, systems, and methods as discussed below can provide a capacitor-free dynamic random-access memory device to increase memory storage density, provide multi-cell storage designs, provide multi-state (e.g., three-state) logic, decrease leakage current, decrease junction current, decrease power consumption, increase charge retention times, and/or decrease refresh rates.

Figure 5:
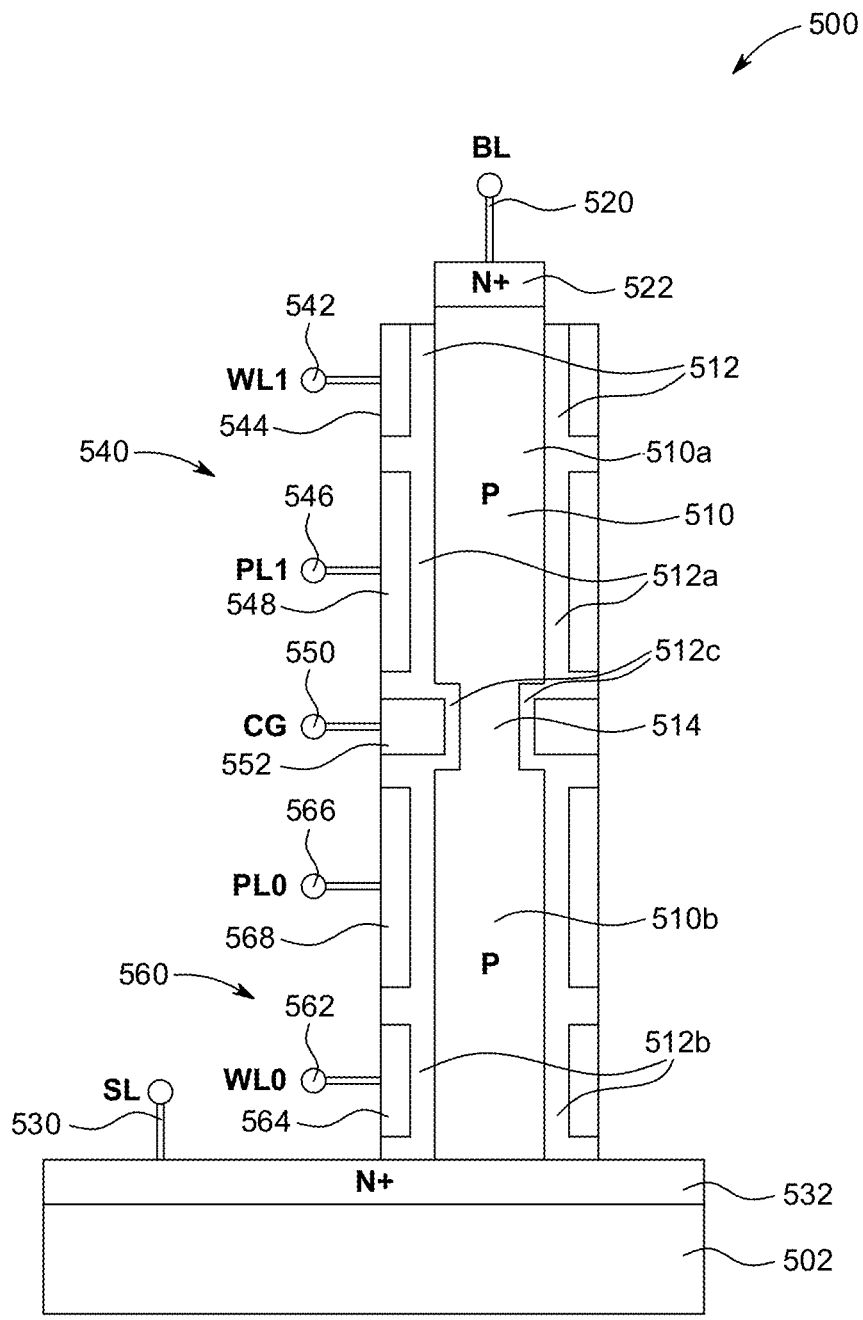
FIG. 5 is a schematic cross-sectional illustration of a multi-cell DFM device, according to an exemplary aspect.
Figure 6:
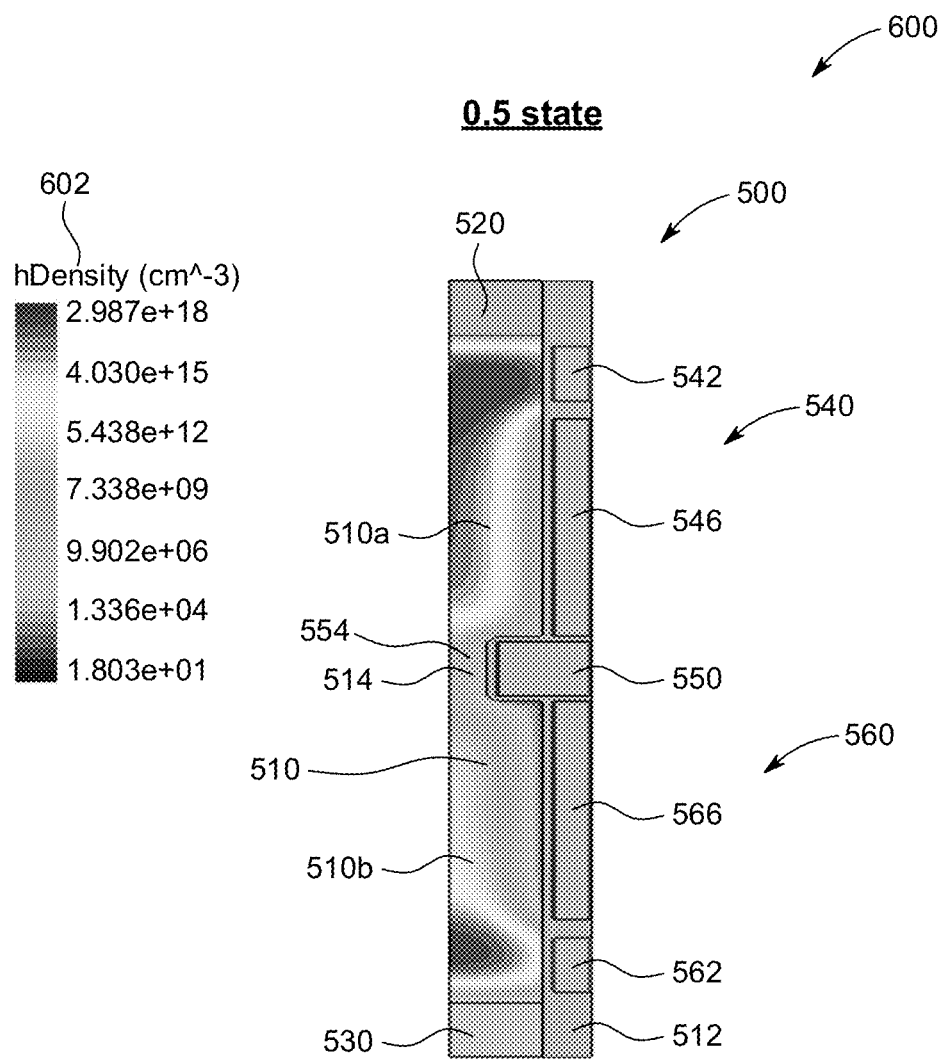
FIG. 6 is a schematic cross-sectional illustration of a charge density distribution of the multi-cell DFM device shown in FIG. 5 for a first program state, according to an exemplary aspect.
Figure 7A:
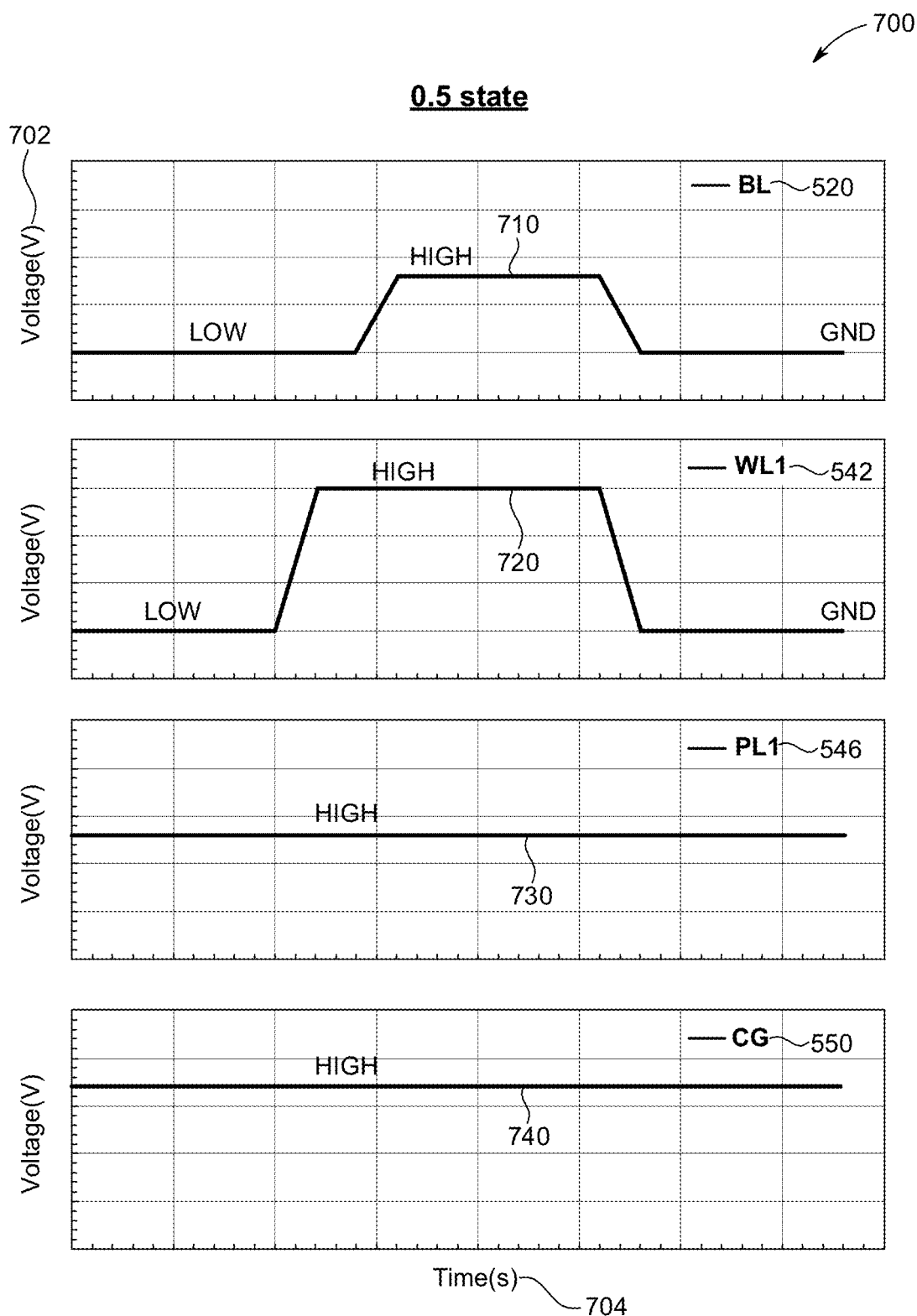
FIGS. 7A and 7B are schematic illustrations of voltage distribution in the multi-cell DFM device shown in FIG. 5 for the first program state shown in FIG. 6, according to an exemplary aspect.
Figure 7B:
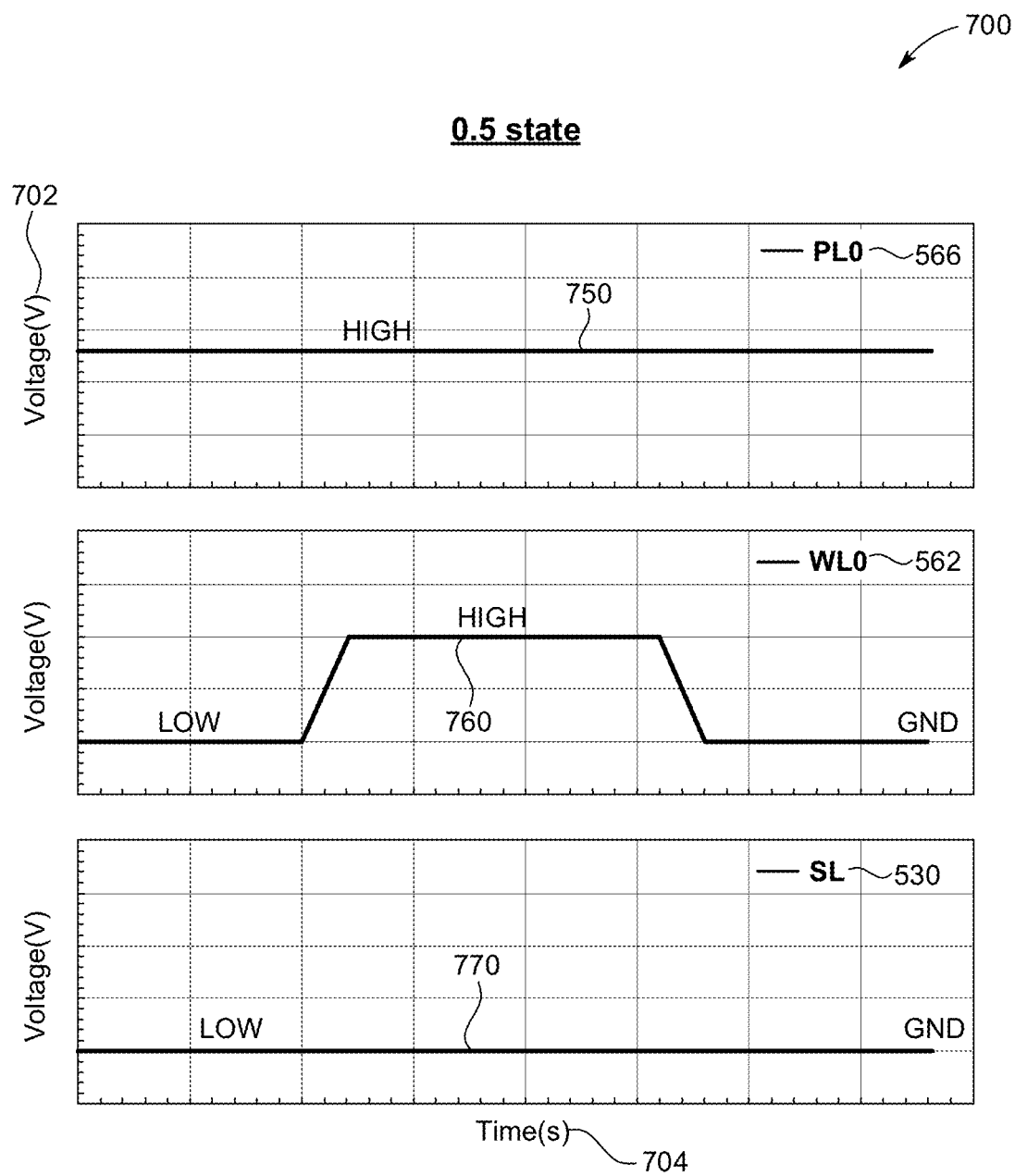
Figure 8:
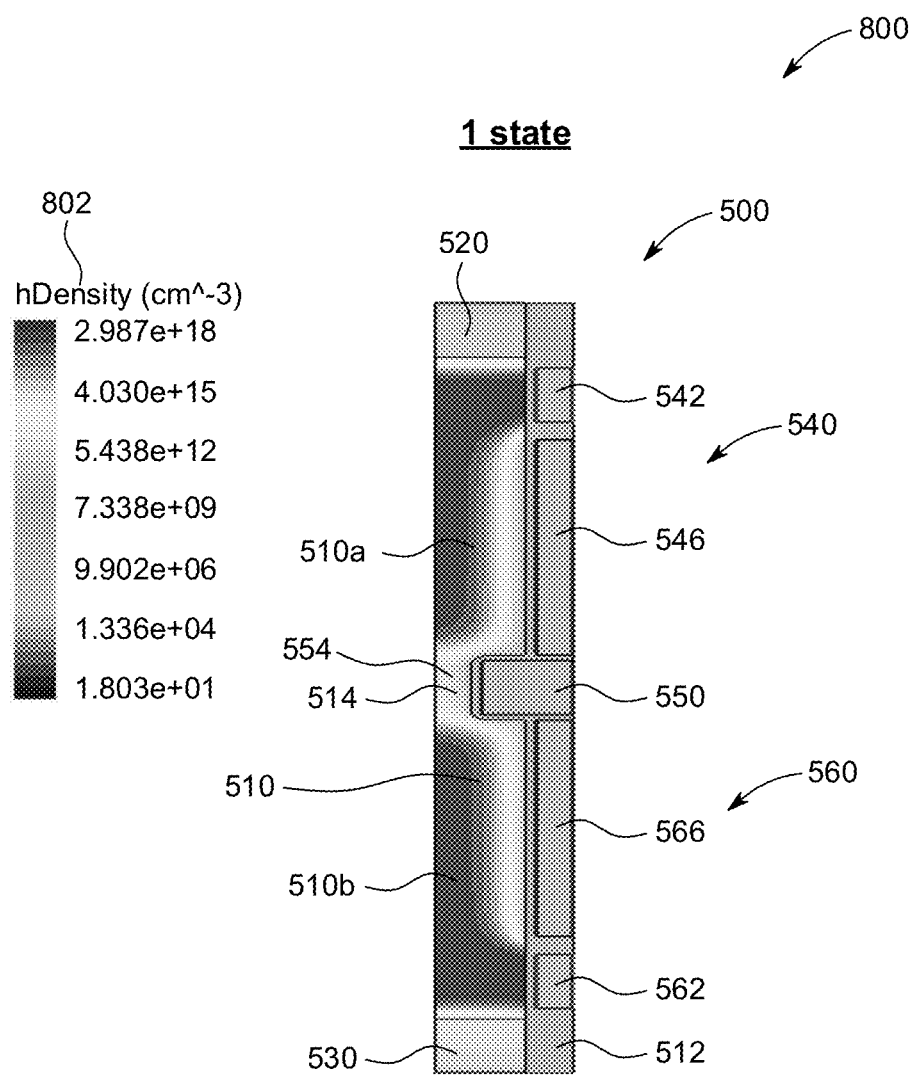
FIG. 8 is a schematic cross-sectional illustration of a charge density distribution of the multi-cell DFM device shown in FIG. 5 for a second program state, according to an exemplary aspect.
Figure 9A:
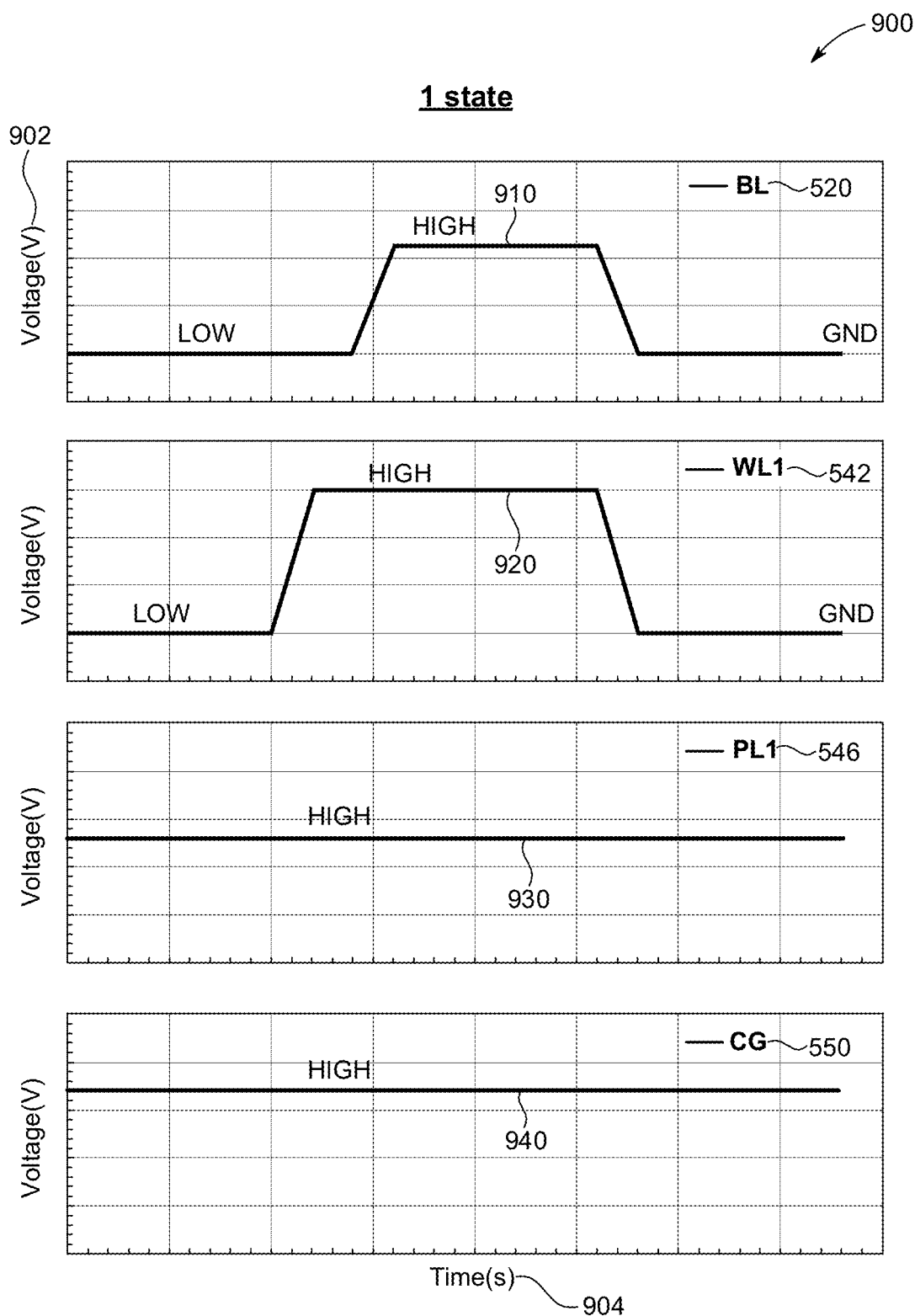
FIGS. 9A and 9B are schematic illustrations of voltage distribution in the multi-cell DFM device shown in FIG. 5 for the second program state shown in FIG. 8, according to an exemplary aspect.
Figure 9B:
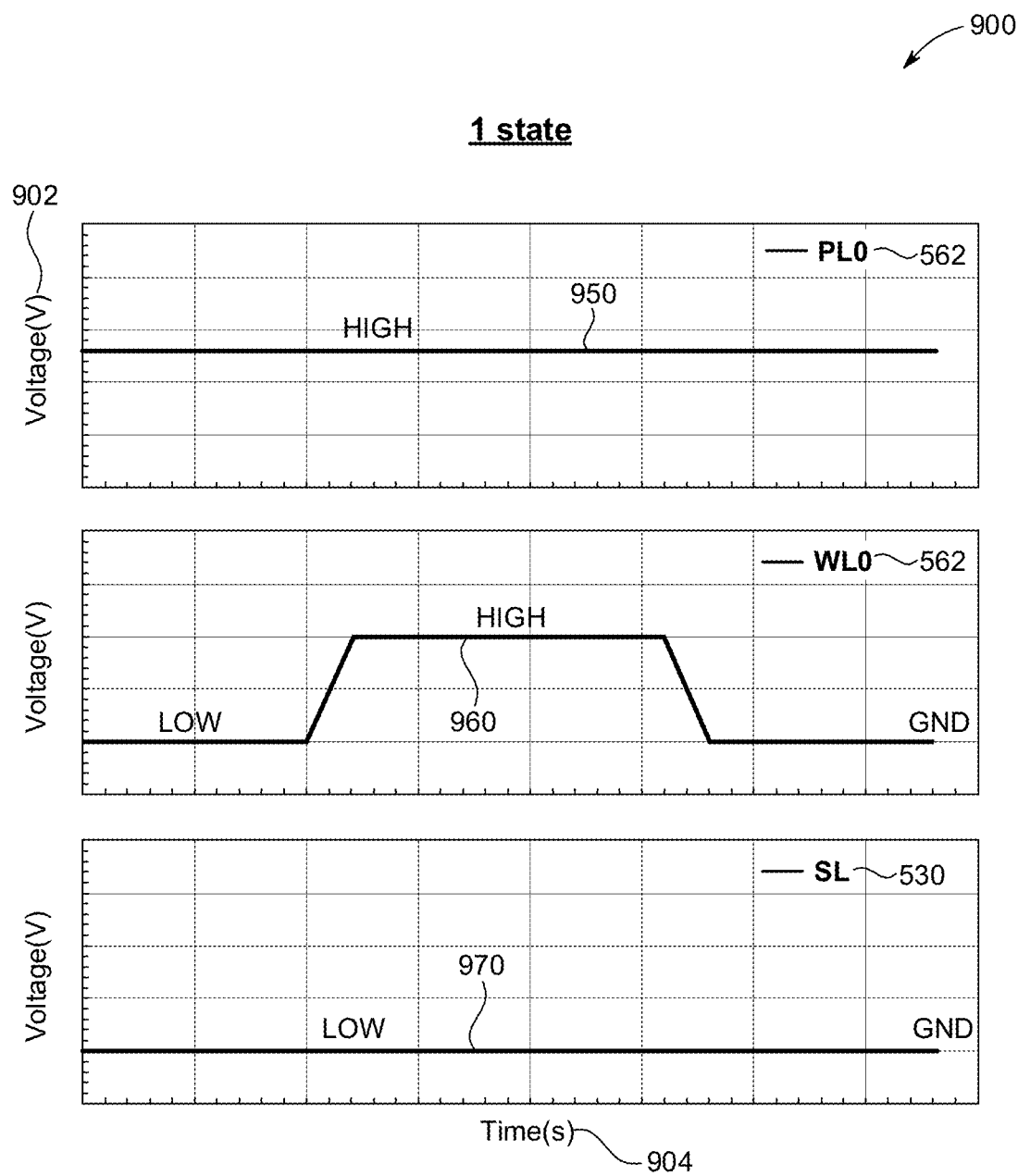
Figure 10:
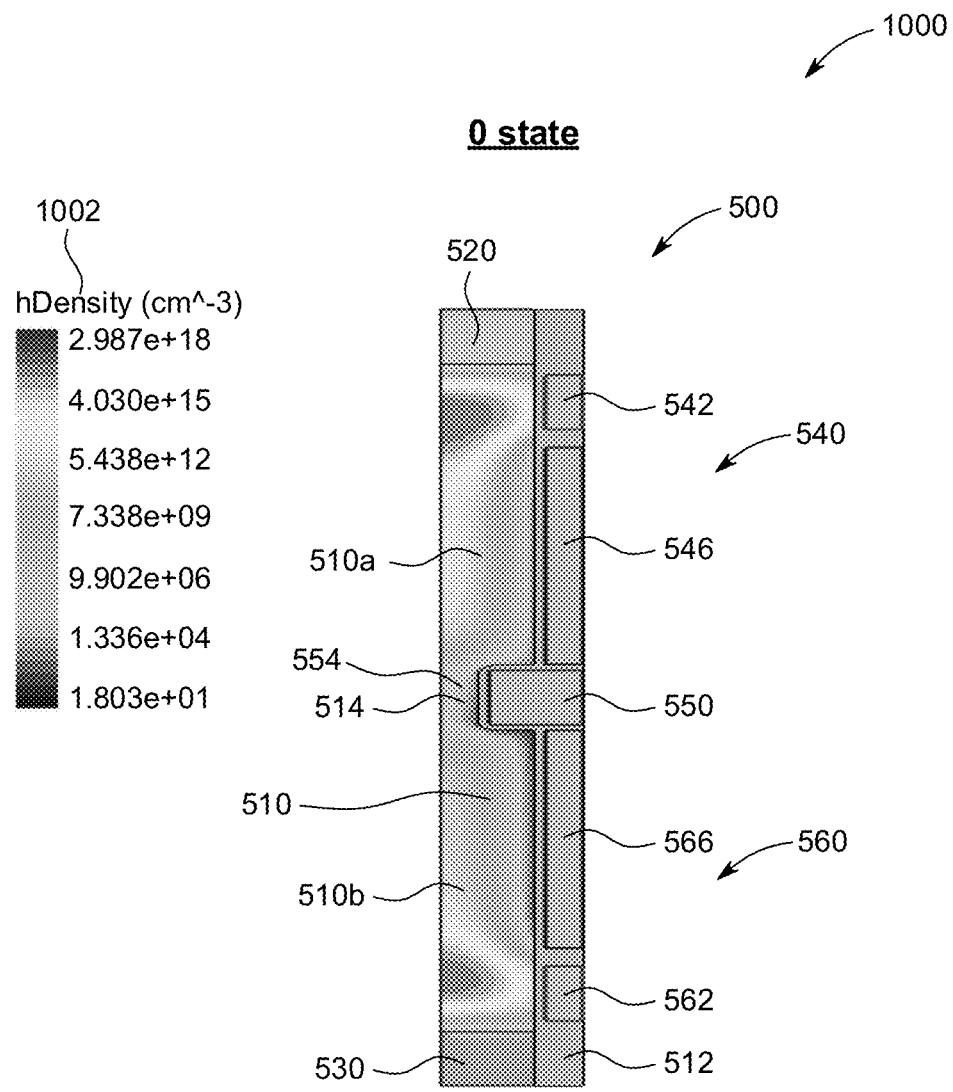
FIG. 10 is a schematic cross-sectional illustration of a charge density distribution of the multi-cell DFM device shown in FIG. 5 for an erase state, according to an exemplary aspect.
Figure 11A:
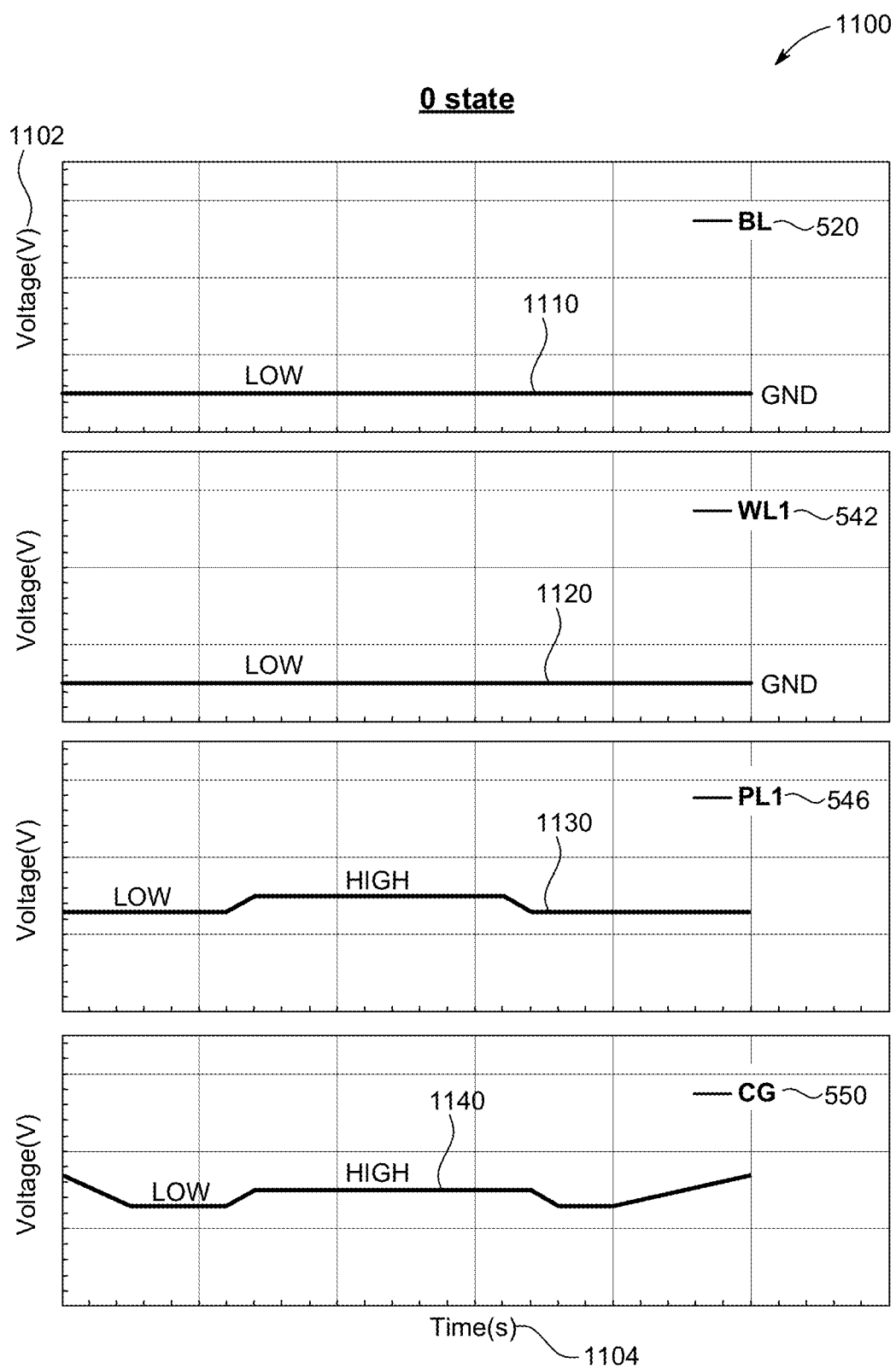
FIGS. 11A and 11B are schematic illustrations of voltage distribution in the multi-cell DFM device shown in FIG. 5 for the erase state, according to an exemplary aspect.
Figure 11B:
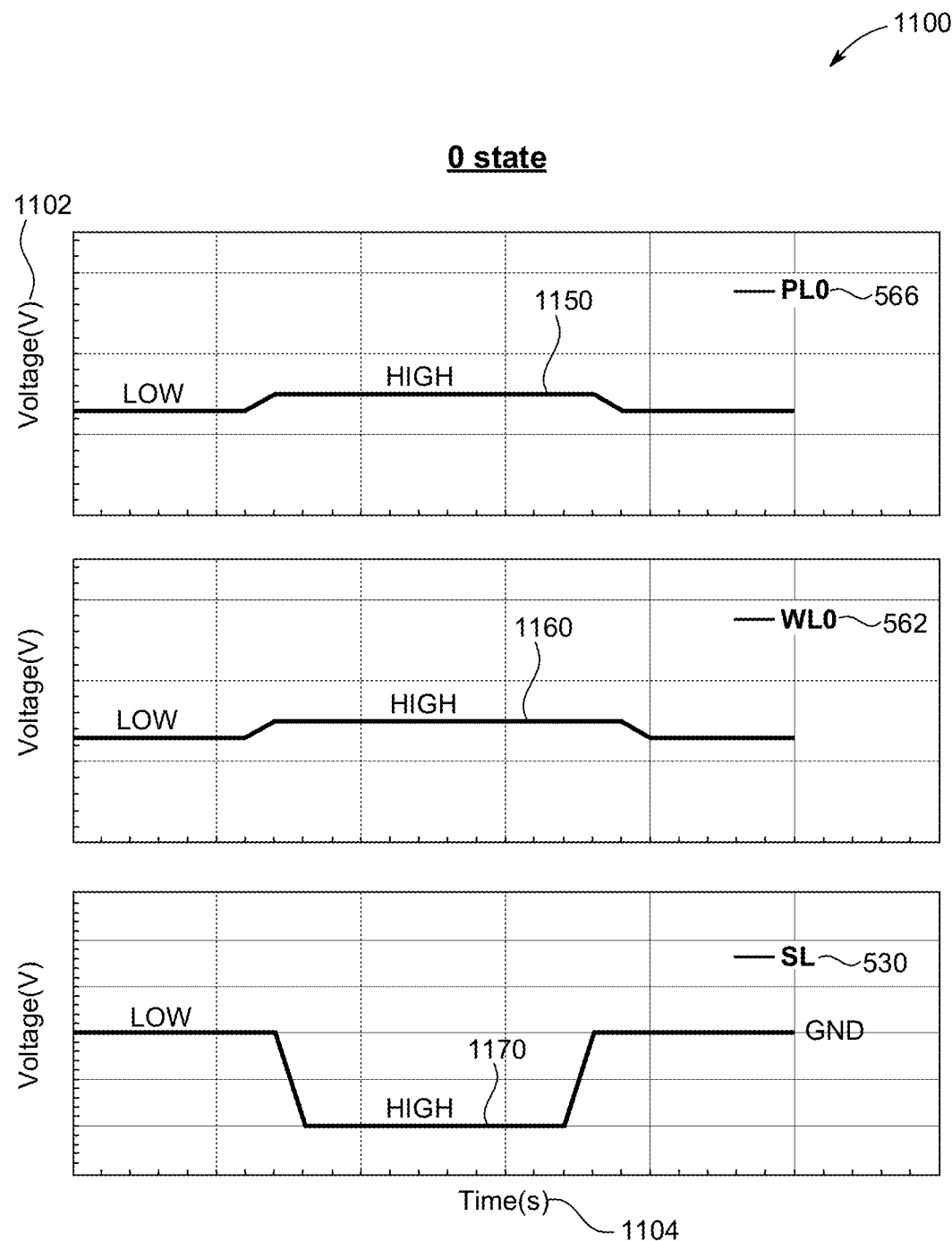

FIGS. 5-11B illustrate multi-cell DFM device 500, according to exemplary aspects. FIG. 5 is a schematic cross-sectional illustration of multi-cell DFM device 500, according to an exemplary aspect. FIG. 6 is a schematic cross-sectional illustration of charge density distribution 600 of multi-cell DFM device 500 shown in FIG. 5 for a first program state (0.5 state), according to an exemplary aspect. FIGS. 7A and 7B are schematic illustrations of voltage distribution 700 in multi-cell DFM device 500 shown in FIG. 5 for the first program state (0.5 state) shown in FIG. 6, according to an exemplary aspect. FIG. 8 is a schematic cross-sectional illustration of charge density distribution 800 of multi-cell DFM device 500 shown in FIG. 5 for a second program state (1 state), according to an exemplary aspect. FIGS. 9A and 9B are schematic illustrations of voltage distribution 900 in multi-cell DFM device 500 shown in FIG. 5 for the second program state (1 state) shown in FIG. 8, according to an exemplary aspect. FIG. 10 is a schematic cross-sectional illustration of charge density distribution 1000 of multi-cell DFM device 500 shown in FIG. 5 for an erase state (0 state), according to an exemplary aspect. FIGS. 11A and 11B are schematic illustrations of voltage distribution 1100 in multi-cell DFM device 500 shown in FIG. 5 for the erase state (0 state), according to an exemplary aspect.

Multi-cell DFM device 500 can be configured to operate as a volatile capacitor-free dynamic random-access 3D memory device. Multi-cell DFM device 500 can be further configured to increase memory storage and provide multi-cell storage. Multi-cell DFM device 500 can be further configured to provide multi-state logic operations (e.g., three-state: 0 state, 0.5 state, 1 state). Multi-cell DFM device 500 can be further configured to decrease leakage current, decrease junction current, and decrease power consumption. Multi-cell DFM device 500 can be further configured to increase charge retention times (e.g., greater than 100 ms at 85° C. operating temperature) and decrease refresh rates (e.g., less than 10 Hz). Multi-cell DFM device 500 can be further configured to provide faster operation speeds and higher density than DRAM or other types of volatile memory. Multi-cell DFM device 500 can be further configured to provide block refresh and block erase operations similar to flash memory functionality. Although multi-cell DFM device 500 is shown in FIGS. 5-11B as a stand-alone apparatus and/or system, the aspects of this disclosure can be used with other apparatuses, systems, and/or methods, such as, but not limited to, 3D memory device 100, dual gate SGT device 200, DFM device 300, manufacturing method 1200, and/or flow diagram 1300.

As shown in FIG. 5, multi-cell DFM device 500 can include substrate 502, pillar 510, dielectric 512, bit line (BL) 520, BL contact 522, source line (SL) 530, SL contact 532, first DFM cell 540, control gate (CG) 550, CG contact 552, and second DFM cell 560. In some aspects, multi-cell DFM device 500 can be a vertical 3D memory device. In some aspects, multi-cell DFM device 500 can include one or more DFM devices (e.g., DFM device 300 shown in FIG. 3). In some aspects, multi-cell DFM device 500 can include one or more NAND DFM devices. In some aspects, multi-cell DFM device 500 can be part of a memory array, for example, memory array 160 of 3D memory device 100 shown in FIG. 1.

Substrate 502 can be configured to support pillar 510, dielectric 512, BL contact 522, SL contact 532, first DFM cell 540, CG contact 552, and second DFM cell 560. Substrate 502 can be coupled to SL contact 532. In some aspects, substrate 502 can be a p-type semiconductor (e.g., p), for example, doped silicon. In some aspects, substrate 502 can include any planar wafer material, for example, Si, Ge, SiGe, GaAs, Group IV semiconductor, Group III-V semiconductor, Group II-VI semiconductor, graphene, sapphire, and/or any other semiconductor.

Pillar 510 can be configured to store electrical charge (e.g., holes). Pillar 510 can be between BL contact 522 and SL contact 532. In some aspects, pillar 510 can include a semiconductor material, for example, Si, doped Si, Ge, SiGe, GaAs, Group IV semiconductor, Group III-V semiconductor, Group II-VI semiconductor, graphene, sapphire, and/or any other semiconductor. In some aspects, pillar 510 can be doped (e.g., p-type). In some aspects, pillar 510 can have a doping concentration of about $1\times10^{16}$ cm$^{-1}$ to about $5\times10^{18}$ cm$_{-3}$. For example, pillar 510 can have a doping concentration of about $1\times10^{18}$ cm$_{-3}$. In some aspects, pillar 510 can have a diameter of about 1 nm to about 100 nm. For example, pillar 510 can have a diameter of about 50 nm. In some aspects, pillar 510 can be monolithic. For example, as shown in FIG. 5, pillar 510 can be a single monolithic vertical pillar. In some aspects, pillar 510 can be formed from the same material as substrate 502.

In some aspects, pillar 510 can be separated into first and second pillar regions 510a, 510b, corresponding to first and second DFM cells 540, 560, respectively. First pillar region 510a can be configured to store a first electrical charge (e.g., holes). Second pillar region 510b can be configured to store a second electrical charge (e.g., holes) separate from the first electrical charge. In some aspects, pillar 510 can include recessed pillar region 514 corresponding to CG 550. Recessed pillar region 514 can be configured to block or prevent electrical charge flow between first and second pillar regions 510a, 510b. In some aspects, first and second electrical charges can be stored separately on first and second pillar regions 510a, 510b, respectively. In some aspects, first and second electrical charges on first and second pillar regions 510a, 510b, respectively, can be independently addressed by multi-cell DFM device 500. In some aspects, pillar 510 can be monolithic. For example, as shown in FIG. 5, first pillar region 510a, second pillar region 510b, and recessed pillar region 510c can be a single monolithic vertical pillar.

Dielectric 512 can be configured to provide electrical insulation between pillar 510 and first and second DFM cells 540, 560. Dielectric 512 can surround pillar 510. In some aspects, dielectric 512 can include a dielectric material, for example, oxide, nitride, oxynitride, ceramic, glass, SOG, polymer, plastic, thermoplastic, resin, laminate, high-k dielectric, a combination thereof, and/or any other electrically insulating material. In some aspects, dielectric 512 can be a high-k dielectric configured to increase a gate capacitance and decrease a leakage current in pillar 510. In some aspects, dielectric 512 can have a radial thickness of about 1 nm to about 30 nm. For example, dielectric 512 can have a radial thickness of about 3 nm.

In some aspects, dielectric 512 can be separated into first and second dielectric regions 512a, 512b, corresponding to first and second DFM cells 540, 560, respectively. In some aspects, dielectric 512 can include recessed dielectric region 512c corresponding to CG 550. In some aspects, dielectric 512 can be monolithic. For example, as shown in FIG. 5, first dielectric region 512a, second dielectric region 512b, and recessed dielectric region 512c can be a single monolithic dielectric.

BL 520 can be configured to address pillar 510 in multi-cell DFM device 500. BL 520 can be further configured to flow electrical charge through first and second DFM cells 540, 560. BL 520 can be coupled to BL contact 522. BL contact 522 can be configured to act as a drain connection to pillar 510. BL contact 522 can be coupled to first DFM cell 540. In some aspects, BL contact 522 can be n-type (e.g., n+) and pillar 510 can be p-type (e.g., p). In some aspects, BL contact 522 can include a conductive material, for example, a metal, a doped semiconductor, polysilicon, tungsten, and/or any other suitable conductor.

SL 530 can be configured to address pillar 510 in multi-cell DFM device 500. SL 530 can be further configured to flow electrical charge through first and second DFM cells 540, 560. SL 530 can be coupled to SL contact 532. SL contact 532 can be configured to act as a source connection to pillar 510. SL contact 532 can be coupled to second DFM cell 560. In some aspects, SL contact 532 can be n-type (e.g., n+) and pillar 510 can be p-type (e.g., p). In some aspects, SL contact 532 can include a conductive material, for example, a metal, a doped semiconductor, polysilicon, tungsten, and/or any other suitable conductor. In some aspects, different voltage combinations applied to BL 520, SL 530, first DFM cell 540, CG 550, and second DFM cell 560 can define read, program (write), and erase operations in multi-cell DFM device 500.

First DFM cell 540 can be configured to read, program, and erase electrical charge on pillar 510, for example, first pillar region 510a. First DFM cell 540 can be coupled to BL contact 522. First DFM cell 540 can include word line (WL1) 542, WL1 contact 544, plate line (PL1) 546, and PL1 contact 548. WL1 542 can be configured to address first pillar region 510a in multi-cell DFM device 500. WL1 542 can be further configured to address and non-destructively read electrical charge on first pillar region 510a. In some aspects, WL1 542 can act as a top select gate connection. WL1 542 can be coupled to WL1 contact 544. WL1 contact 544 can be configured to act as a first gate connection to first pillar region 510a. WL1 contact 544 can surround a first portion of first dielectric region 512a which surrounds a first portion of first pillar region 510a thereby forming a first concentric transistor in first DFM cell 540. In some aspects, WL1 contact 544 can include a conductive material (e.g., metal, polysilicon, tungsten, etc.). In some aspects, WL1 542 can provide voltage to WL1 contact 544, thereby inducing an electric field within first pillar region 510a, to read, program, or erase charge on first pillar region 510a. In some aspects, as shown in FIG. 5, WL1 contact 544 can be between BL contact 522 and PL1 contact 548.

PL1 546 can be configured to address first pillar region 510a in multi-cell DFM device 500. PL1 546 can be further configured to program (e.g., write) first pillar region 510a. In some aspects, PL1 546 can act as a traditional current-valve gate (e.g., similar to a MOSFET gate) for first pillar region 510a and cover a majority of a length of first pillar region 510a. PL1 546 can be coupled to PL1 contact 548. PL1 contact 548 can be configured to act as a second gate connection to first pillar region 510a. PL1 contact 548 can surround a second portion of first dielectric region 512a which surrounds a second portion of first pillar region 510a thereby forming a second concentric transistor in first DFM cell 540. In some aspects, PL1 contact 548 can include a conductive material (e.g., metal, polysilicon, tungsten, etc.). In some aspects, PL1 546 can provide voltage to PL1 contact 548, thereby inducing an electric field within first pillar region 510a, to read, program, or erase charge on first pillar region 510a. In some aspects, first DFM cell 540 can form a DFM device, for example, DFM device 300 shown in FIG. 3.

Second DFM cell 560 can be configured to read, program, and erase electrical charge on pillar 510, for example, second pillar region 510b. Second DFM cell 560 can be coupled to SL contact 532. Second DFM cell 560 can include word line (WL0) 562, WL0 contact 564, plate line (PL0) 566, and PL0 contact 568. WL0 562 can be configured to address second pillar region 510b in multi-cell DFM device 500. WL0 562 can be further configured to address and non-destructively read electrical charge on second pillar region 510b. In some aspects, WL0 562 can act as a bottom select gate connection. WL0 562 can be coupled to WL0 contact 564. WL0 contact 564 can be configured to act as a first gate connection to second pillar region 510b. WL0 contact 564 can surround a first portion of second dielectric region 512b which surrounds a first portion of second pillar region 510b thereby forming a first concentric transistor in second DFM cell 560. In some aspects, WL0 contact 564 can include a conductive material (e.g., metal, polysilicon, tungsten, etc.). In some aspects, WL0 562 can provide voltage to WL0 contact 564, thereby inducing an electric field within second pillar region 510b, to read, program, or erase charge on second pillar region 510b. In some aspects, as shown in FIG. 5, WL0 contact 564 can be between SL contact 532 and PL0 contact 568.

PL0 566 can be configured to address second pillar region 510b in multi-cell DFM device 500. PL0 566 can be further configured to program (e.g., write) second pillar region 510b. In some aspects, PL0 566 can act as a traditional current-valve gate (e.g., similar to a MOSFET gate) for second pillar region 510b and cover a majority of a length of second pillar region 510b. PL0 566 can be coupled to PL0 contact 568. PL0 contact 568 can be configured to act as a second gate connection to second pillar region 510b. PL0 contact 568 can surround a second portion of second dielectric region 512b which surrounds a second portion of second pillar region 510b thereby forming a second concentric transistor in second DFM cell 560. In some aspects, PL0 contact 568 can include a conductive material (e.g., metal, polysilicon, tungsten, etc.). In some aspects, PL0 566 can provide voltage to PL0 contact 568, thereby inducing an electric field within second pillar region 510b, to read, program, or erase charge on second pillar region 510b. In some aspects, second DFM cell 560 can form a DFM device, for example, DFM device 300 shown in FIG. 3. In some aspects, PL1 contact 548 and PL0 contact 568 can be between WL1 contact 544 and WL0 contact 564. In some aspects, first and second DFM cells 540, 560 can be configured to be independently addressed. In some aspects, first and second DFM cells 540, 560 can be configured to be charged separately.

CG 550 can be configured to provide charge isolation region 554 between first and second DFM cells 540, 560, for example, at recessed pillar region 514. CG 550 can be between first and second DFM cells 540, 560 and correspond to recessed pillar region 514. In some aspects, charge isolation region 554 can have a charge density no greater than $1 \times 10^{14}$ cm$^{-3}$. For example, as shown in FIG. 8, in the 1 state, charge isolation region 554 between first and second pillar regions 510a, 510b can have charge density 802 of about $5 \times 10^{12}$ cm$^{-3}$. CG 550 can be coupled to first DFM cell 540 and second DFM cell 560. CG 550 can be coupled to CG contact 552. CG contact 552 can be configured to act as a gate connection to recessed pillar region 514. CG contact 552 can surround recessed dielectric region 512c which surrounds recessed pillar region 514 thereby forming a fifth concentric transistor in multi-cell DFM device 500 between first and second DFM cells 540, 560. In some aspects, CG contact 552 can include a conductive material (e.g., metal, polysilicon, tungsten, etc.). In some aspects, CG 550 can provide voltage to CG contact 552, thereby inducing an electric field within recessed pillar region 514, to block or prevent charge flow on recessed pillar region 514. In some aspects, as shown in FIG. 5, CG contact 552 can be between PL1 contact 548 and PL0 contact 568. In some aspects, as shown in FIG. 5, CG contact 552 can be between WL1 contact 544 and WL0 contact 564.

As shown in FIG. 6, charge density distribution 600 shows charge (e.g., hole) density 602 within multi-cell DFM device 500 for a first logic state (0.5 state) after 100 ms at an operating temperature of 85° C. In some aspects, as shown in FIG. 6, in the first logic state (0.5 state), first pillar region 510a of first DFM cell 540 can include a first electrical charge (e.g., holes). Charge density distribution 600 can include charge (e.g., hole) density 602, which can range from about $1.8 \times 10^1$ cm$_{-3}$ to about $3 \times 10^{18}$ cm$_{-3}$. The first logic state (0.5 state) represents a program (write) operation on multi-cell DFM device 500, whereby different voltage combinations applied to BL 520, SL 530, WL1 542, PL1 546, CG 550, WL0 562, and PL0 566 form charge (e.g., holes) on first pillar region 510a of multi-cell DFM device 500. In some aspects, as shown in FIG. 6, in the first logic state (0.5 state), a majority of first pillar region 510a retains charge of at least $1 \times 10^{17}$ cm$_{-3}$ after 100 ms at an operating temperature of 85° C. For example, a portion of first pillar region 510a adjacent PL1 contact 548 retains charge of at least $1 \times 10^{17}$ cm$_{-3}$.

In some aspects, in the first logic state (0.5 state), first pillar region 510a of first DFM cell 540 can include electrical charge (e.g., holes) of at least $1 \times 10^{17}$ cm$_{-3}$ and second pillar region 510b of second DFM cell 560 can include substantially no electrical charge. For example, a majority of first pillar region 510a retains charge of at least $1 \times 10^{17}$ cm$^{-3}$ after 100 ms at an operating temperature of 85° C. In some aspects, in the first logic state (0.5 state), second pillar region 510b of second DFM cell 560 can include electrical charge (e.g., holes) of at least $1 \times 10^{17}$ cm$^{-3}$ and first pillar region 510a of first DFM cell 540 can include substantially no electrical charge. For example, a majority of second pillar region 510b retains charge of at least $1 \times 10^{17}$ cm$_{-3}$ after 100 ms at an operating temperature of 85° C.

As shown in FIGS. 7A and 7B, voltage distribution 700 shows BL voltage waveform 710, WL1 voltage waveform 720, PL1 voltage waveform 730, CG voltage waveform 740, PL0 voltage waveform 750, WL0 voltage waveform 760, and SL voltage waveform 770 within multi-cell DFM device 500 for the first logic state (0.5 state) after 100 ms at an operating temperature of 85° C. Voltage distribution 700 shows voltage 702 applied by BL 520, SL 530, WL1 542, PL1 546, CG 550, WL0 562, and PL0 566 to pillar 510 in multi-cell DFM device 500 over time 704. In some aspects, as shown in FIGS. 7A and 7B, in the first logic state (0.5 state), BL contact 522 can apply a HIGH level voltage, WL1 contact 544 can apply a HIGH level voltage, PL1 contact 548 can apply a HIGH level voltage, CG contact 552 can apply a HIGH level voltage, WL0 contact 564 can apply a HIGH level voltage, PL0 contact 568 can apply a HIGH level voltage, and SL contact 532 can apply a LOW level voltage (e.g., GND). In some aspects, in the first logic state (0.5 state), BL contact 522 can apply a voltage of about 0.5 V to about 1.2 V, WL1 contact 544 can apply a voltage of about 1 V to about 2 V, PL1 contact 548 can apply a voltage of about 0.5 V to about 1.2 V, CG contact 552 can apply a voltage of about 0.8 V to about 1.5 V, WL0 contact 564 can apply a voltage of about 0.5 V to about 1.5 V, PL0 contact 568 can apply a voltage of about 0.5 V to about 1.2 V, and SL contact 532 can apply a voltage of about 0 V. In some aspects, as shown in FIGS. 6, 7A, and 7B, voltage distribution 700 applied to BL 520, SL 530, first DFM cell 540, CG 550, and second DFM cell 560 can define first logic state (0.5 state) in multi-cell DFM device 500, for example, by storing charge (e.g. holes) on first pillar region 510*a* of first DFM cell 540.

As shown in FIG. 8, charge density distribution 800 shows charge (e.g., hole) density 802 within multi-cell DFM device 500 for a second logic state (1 state) after 100 ms at an operating temperature of 85° C. In some aspects, as shown in FIG. 8, in the second logic state (1 state), first pillar region 510*a* of first DFM cell 540 can include a first electrical charge (e.g., holes) and second pillar region 510*b* of second DFM cell 560 can include a second electrical charge (e.g., holes) separate from the first electrical charge. Charge density distribution 800 can include charge (e.g., hole) density 802, which can range from about $1.8 \times 10^1$ cm$^{-3}$ to about $3 \times 10^{18}$ cm$^{-3}$. The second logic state (1 state) represents a program (write) operation on multi-cell DFM device 500, whereby different voltage combinations applied to BL 520, SL 530, WL1 542, PL1 546, CG 550, WL0 562, and PL0 566 form charge (e.g., holes) on first pillar region 510*a* of first DFM cell 540, form charge (e.g., holes) on second pillar region 510*b* of second DFM cell 560, and form substantially no charge on recessed pillar region 514 due to charge isolation region 554. In some aspects, as shown in FIG. 8, in the second logic state (1 state), a majority of first pillar region 510*a* and a majority of second pillar region 510*b* retain charge of at least $1 \times 10^{17}$ cm$^{-3}$ after 100 ms at an operating temperature of 85° C. For example, a portion of first pillar region 510*a* adjacent PL1 contact 548 and a portion of second pillar region 510*b* adjacent PL0 contact 568 retain charge of at least $1 \times 10^{17}$ cm$^{-3}$.

As shown in FIGS. 9A and 9B, voltage distribution 900 shows BL voltage waveform 910, WL1 voltage waveform 920, PL1 voltage waveform 930, CG voltage waveform 940, PL0 voltage waveform 950, WL0 voltage waveform 960, and SL voltage waveform 970 within multi-cell DFM device 500 for the second logic state (1 state) after 100 ms at an operating temperature of 85° C. Voltage distribution 900 shows voltage 902 applied by BL 520, SL 530, WL1 542, PL1 546, CG 550, WL0 562, and PL0 566 to pillar 510 in multi-cell DFM device 500 over time 904. In some aspects, as shown in FIGS. 9A and 9B, in the second logic state (1 state), BL contact 522 can apply a HIGH level voltage, WL1 contact 544 can apply a HIGH level voltage, PL1 contact 548 can apply a HIGH level voltage, CG contact 552 can apply a HIGH level voltage, WL0 contact 564 can apply a HIGH level voltage, PL0 contact 568 can apply a HIGH level voltage, and SL contact 532 can apply a LOW level voltage (e.g., GND). In some aspects, in the second logic state (1 state), BL contact 522 can apply a voltage of about 0.8 V to about 1.5 V, WL1 contact 544 can apply a voltage of about 1 V to about 2 V, PL1 contact 548 can apply a voltage of about 0.5 V to about 1.2 V, CG contact 552 can apply a voltage of about 0.8 V to about 1.5 V, WL0 contact 564 can apply a voltage of about 0.5 V to about 1.5 V, PL0 contact 568 can apply a voltage of about 0.5 V to about 1.2 V, and SL contact 532 can apply a voltage of about 0 V. In some aspects, as shown in FIGS. 8, 9A, and 9B, voltage distribution 900 applied to BL 520, SL 530, first DFM cell 540, CG 550, and second DFM cell 560 can define second logic state (1 state) in multi-cell DFM device 500, for example, by storing charge (e.g. holes) on first pillar region 510*a* of first DFM cell 540 and second pillar region 510*b* of second DFM cell 560.

As shown in FIG. 10, charge density distribution 1000 shows charge (e.g., hole) density 1002 within multi-cell DFM device 500 for a third logic state (0 state) after 100 ms at an operating temperature of 85° C. In some aspects, as shown in FIG. 10, in the third logic state (0 state), first pillar region 510*a* of first DFM cell 540 and second pillar region 510*b* of second DFM cell 560 can include substantially no electrical charge (e.g., no holes). Charge density distribution 1000 can include charge (e.g., hole) density 1002, which can range from about $1.8 \times 10^1$ cm$_{-3}$ to about $3 \times 10^{18}$ cm$_{-3}$. The third logic state (0 state) represents an erase operation on multi-cell DFM device 500, whereby different voltage combinations applied to BL 520, SL 530, WL1 542, PL1 546, CG 550, WL0 562, and PL0 566 remove charge (e.g., holes) on first pillar region 510*a* of first DFM cell 540, second pillar region 510*b* of second DFM cell 560, and recessed pillar region 514 of CG 550 such that pillar 510 has substantially no charge (e.g., no holes). In some aspects, as shown in FIG. 10, in the third logic state (0 state), a majority of first pillar region 510*a* and a majority of second pillar region 510*b* have charge no greater than $1 \times 10^{15}$ cm$_{-3}$ after 100 ms at an operating temperature of 85° C. For example, a portion of first pillar region 510*a* adjacent PL1 contact 548 and a portion of second pillar region 510*b* adjacent PL0 contact 568 have charge no greater than least $1 \times 10^{15}$ cm$^{-3}$.

As shown in FIGS. 11A and 11B, voltage distribution 1100 shows BL voltage waveform 1110, WL1 voltage waveform 1120, PL1 voltage waveform 1130, CG voltage waveform 1140, PL0 voltage waveform 1150, WL0 voltage waveform 1160, and SL voltage waveform 1170 within multi-cell DFM device 500 for the third logic state (0 state) after 100 ms at an operating temperature of 85° C. Voltage distribution 1100 shows voltage 1102 applied by BL 520, SL 530, WL1 542, PL1 546, CG 550, WL0 562, and PL0 566 to pillar 510 in multi-cell DFM device 500 over time 1104. In some aspects, as shown in FIGS. 11A and 11B, in the third logic state (0 state), BL contact 522 can apply a LOW level voltage (e.g., GND), WL1 contact 544 can apply a LOW level voltage (e.g., GND), PL1 contact 548 can apply a HIGH level voltage, CG contact 552 can apply a HIGH level voltage, WL0 contact 564 can apply a HIGH level voltage, PL0 contact 568 can apply a HIGH level voltage, and SL contact 532 can apply a HIGH level voltage. In some aspects, in the third logic state (0 state), BL contact 522 can apply a voltage of about 0 V, WL1 contact 544 can apply a voltage of about 0 V, PL1 contact 548 can apply a voltage of about 0.5 V to about 1.5 V, CG contact 552 can apply a voltage of about 0.5 V to about 1.5 V, WL0 contact 564 can apply a voltage of about 0.5 V to about 1.5 V, PL0 contact 568 can apply a voltage of about 0.5 V to about 1.5 V, and SL contact 532 can apply a voltage of about −1 V to about −3 V. In some aspects, in the third logic state (0 state), SL contact 532 can apply a voltage of about −1 V to about −5 V. In some aspects, as shown in FIGS. 10, 11A, and 11B, voltage distribution 1100 applied to BL 520, SL 530, first DFM cell 540, CG 550, and second DFM cell 560 can define third logic state (0 state) in multi-cell DFM device 500, for example, by removing charge (e.g. holes) on first pillar region 510a of first DFM cell 540 and second pillar region 510b of second DFM cell 560.

Exemplary Manufacturing Method

FIGS. 12A through 12K illustrate manufacturing method 1200 for forming multi-cell DFM device 500 shown in FIG. 5, according to exemplary aspects. It is to be appreciated that not all steps in FIGS. 12A through 12K are needed to perform the disclosure provided herein. Further, some of the steps may be performed simultaneously, sequentially, and/or in a different order than shown in FIGS. 12A through 12K. Manufacturing method 1200 shall be described with reference to FIGS. 12A through 12K. However, manufacturing method 1200 is not limited to those example aspects.

Figure 12A:
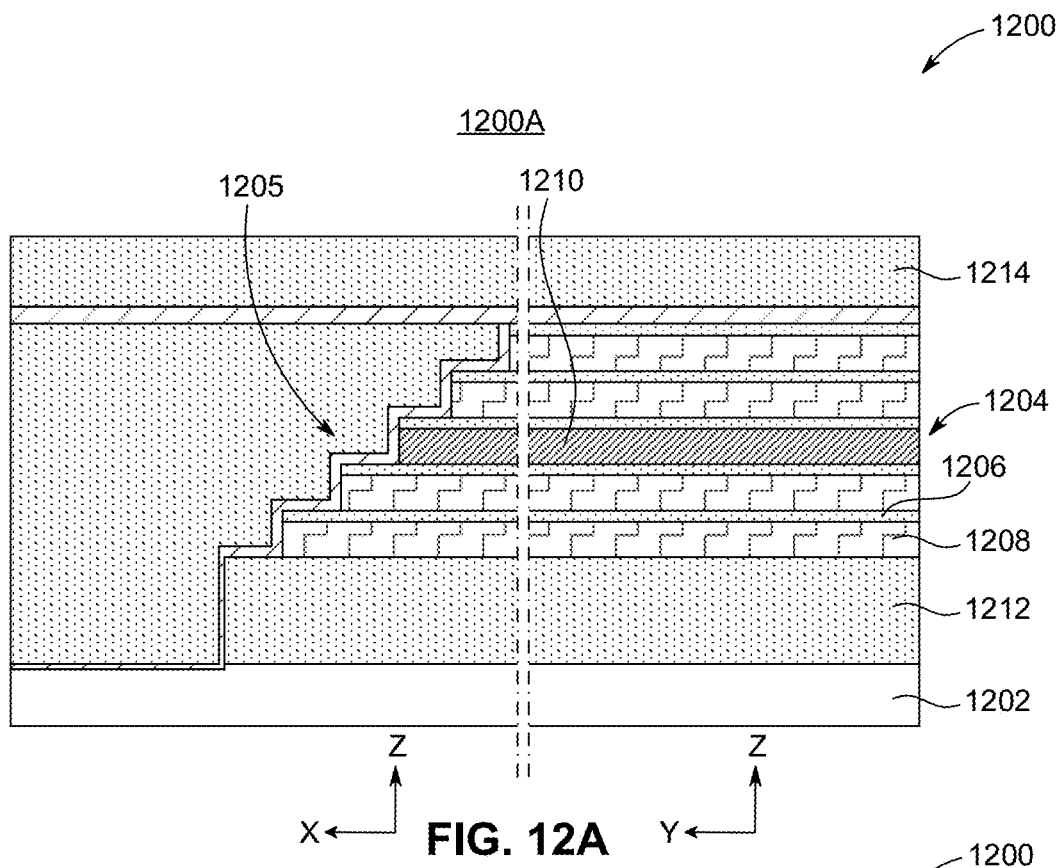

In step 1200A, as shown in the example of FIG. 12A, stack 1204 with staircase structure 1205 including first dielectric layer 1206 (e.g., silicon oxide), second dielectric layer 1208 (e.g., silicon nitride), and sacrificial layer 1210 (e.g., polysilicon), bottom isolation layer 1212, and top isolation layer 1214 are formed as an alternating dielectric stack atop substrate 1202. In some aspects, sacrificial layer 1210 can include silicon, polysilicon, aluminum, chromium, gold, platinum, titanium, tungsten, or any other material not reactive to silicon oxide and silicon nitride etchants.

Figure 12B:
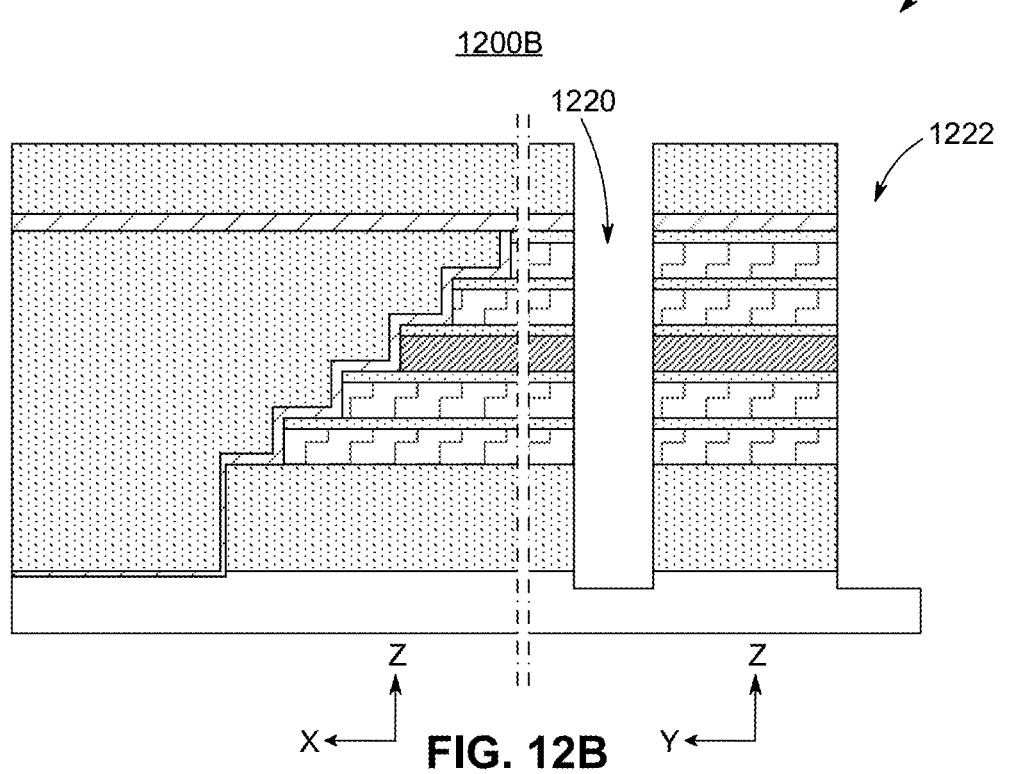

In step 1200B, as shown in the example of FIG. 12B, first channel trench 1220 and second channel trench 1222 are formed in the alternating dielectric stack (e.g., stack 1204). In some aspects, first and second channel trenches 1220, 1222 can be formed by etching in alternating dielectric stack, for example, anisotropic etching.

Figure 12C:
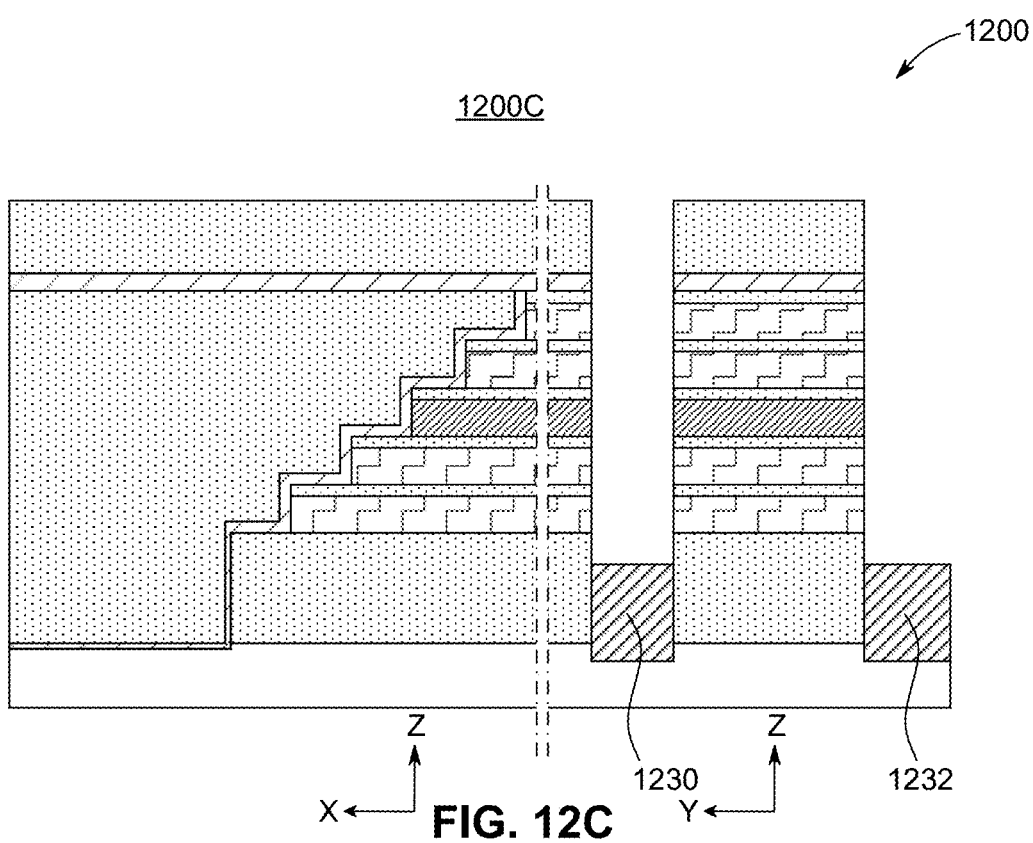

In step 1200C, as shown in the example of FIG. 12C, first bottom contact 1230 and second bottom contact 1232 are formed in first and second channel trenches 1220, 1222, respectively. In some aspects, forming first and second bottom contacts 1230, 1232 can include epitaxially growing first and second bottom contacts 1230, 1232, for example, by selective epitaxial growth (SEG).

Figure 12D:
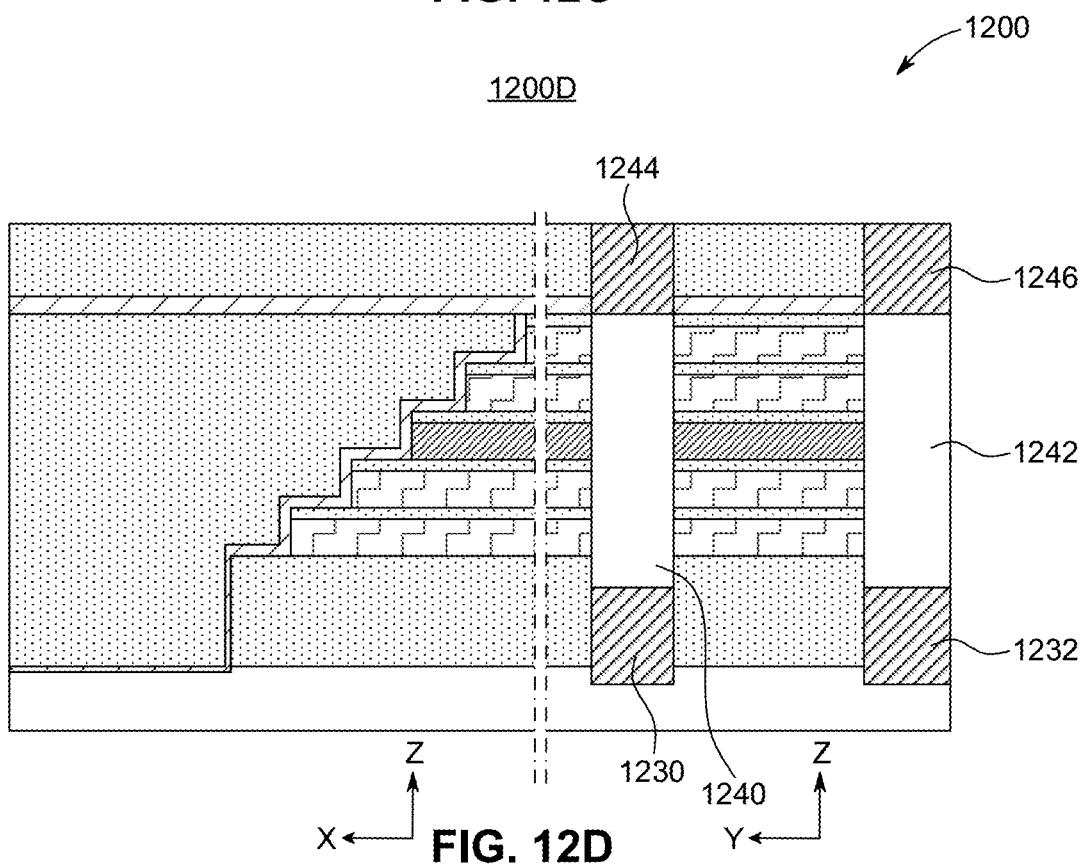

In step 1200D, as shown in the example of FIG. 12D, first pillar 1240 and second pillar 1242 are formed atop first and second bottom contacts 1230, 1232, respectively, and first top contact 1244 and second top contact 1246 are formed atop first and second pillars 1240, 1242, respectively. In some aspects, forming first and second pillars 1240, 1242 can include epitaxially growing first and second pillars 1240, 1242 atop first and second bottom contacts 1230, 1232, for example, by SEG. In some aspects, forming first and second top contacts 1244, 1246 can include doping first and second pillars 1240, 1242 to form first and second top contacts 1244, 1246, for example, by ion implanting.

Figure 12E:
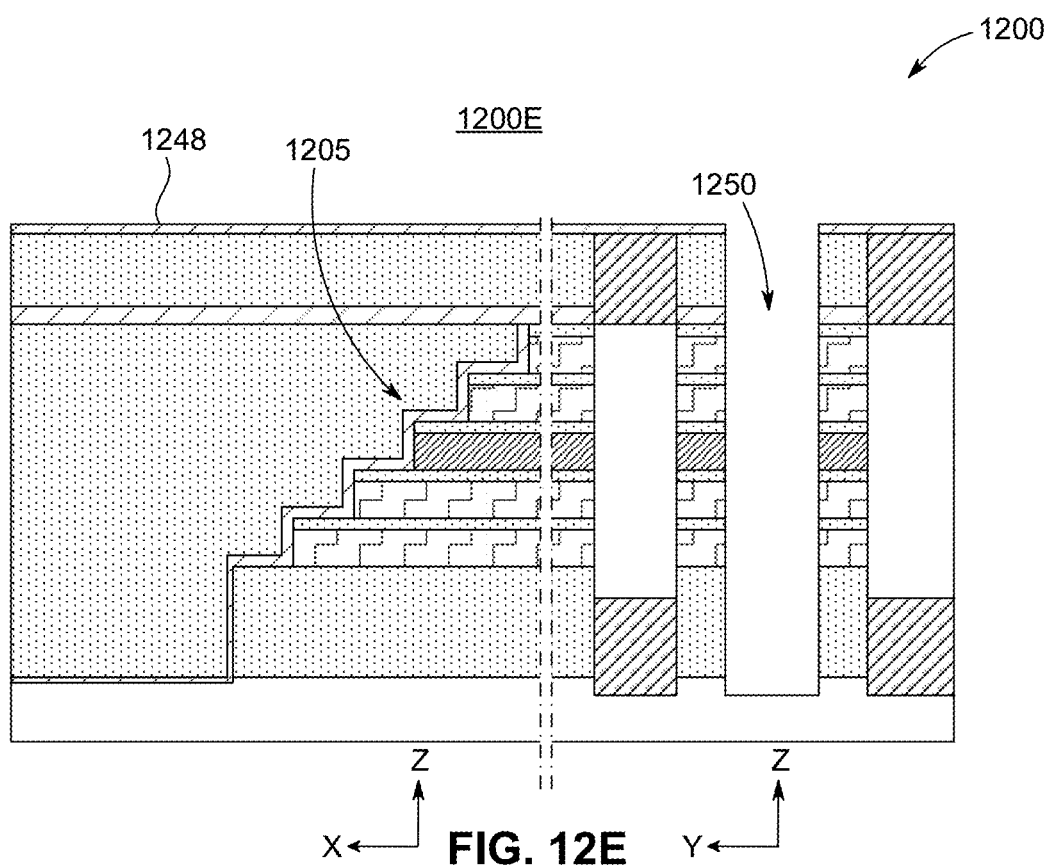

In step 1200E, as shown in the example of FIG. 12E, gate line trench 1250 is formed in the alternating dielectric stack (e.g., stack 1204). FIG. 12E shows a cross-sectional view of gate line trench 1250 along the YZ-plane and a separate (orthogonal) cross-sectional view of staircase structure 1205 along the XZ-plane.

Figure 12F:
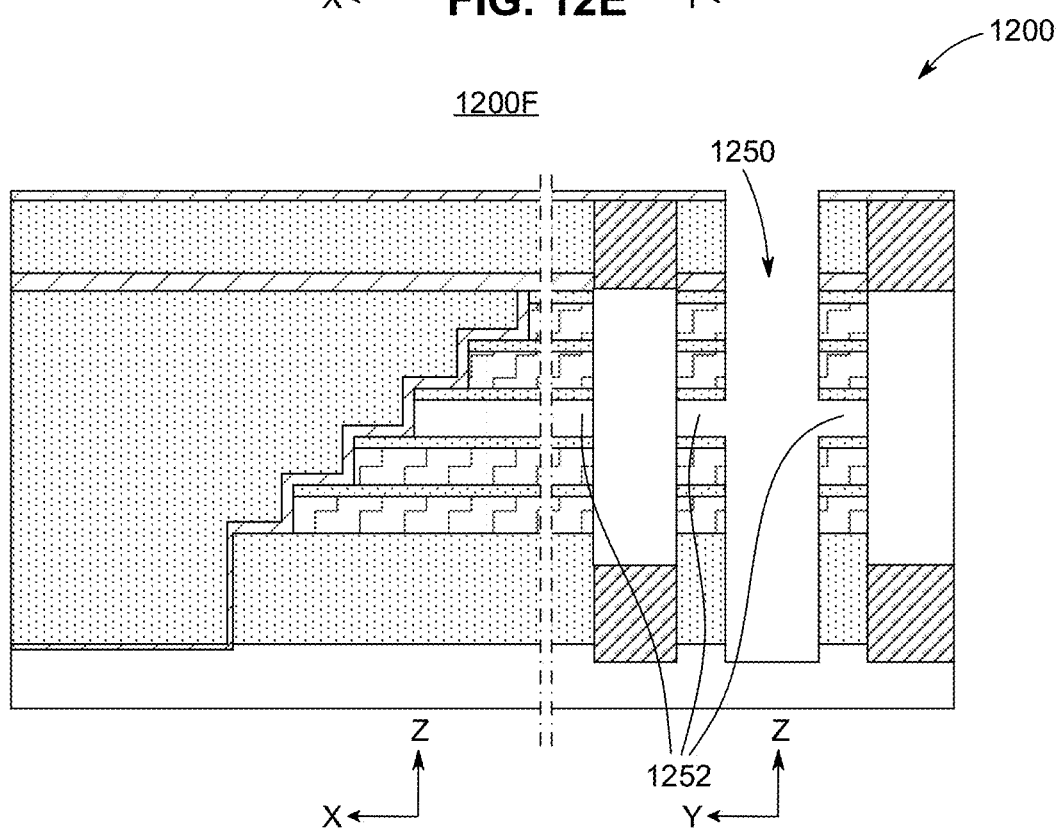

In step 1200F, as shown in the example of FIG. 12F, sacrificial layer 1210 (e.g., polysilicon) is removed in the stack 1204 to form sacrificial layer void 1252. In some aspects, sacrificial layer 1210 can be removed by etching, for example, tetramethylammonium hydroxide (TMAH), potassium hydroxide (KOH), ethylenediamine pyrocatechol (EDP), hydrochloric acid (HCl), aqua regia, SC1 solution (NH4OH:H2O2:H2O)), chlorine ($Cl_2$), carbon tetrachloride ($CCl_4$), boron trichloride ($BCl_3$), or any other etchant not reactive to silicon oxide and silicon nitride.

Figure 12G:
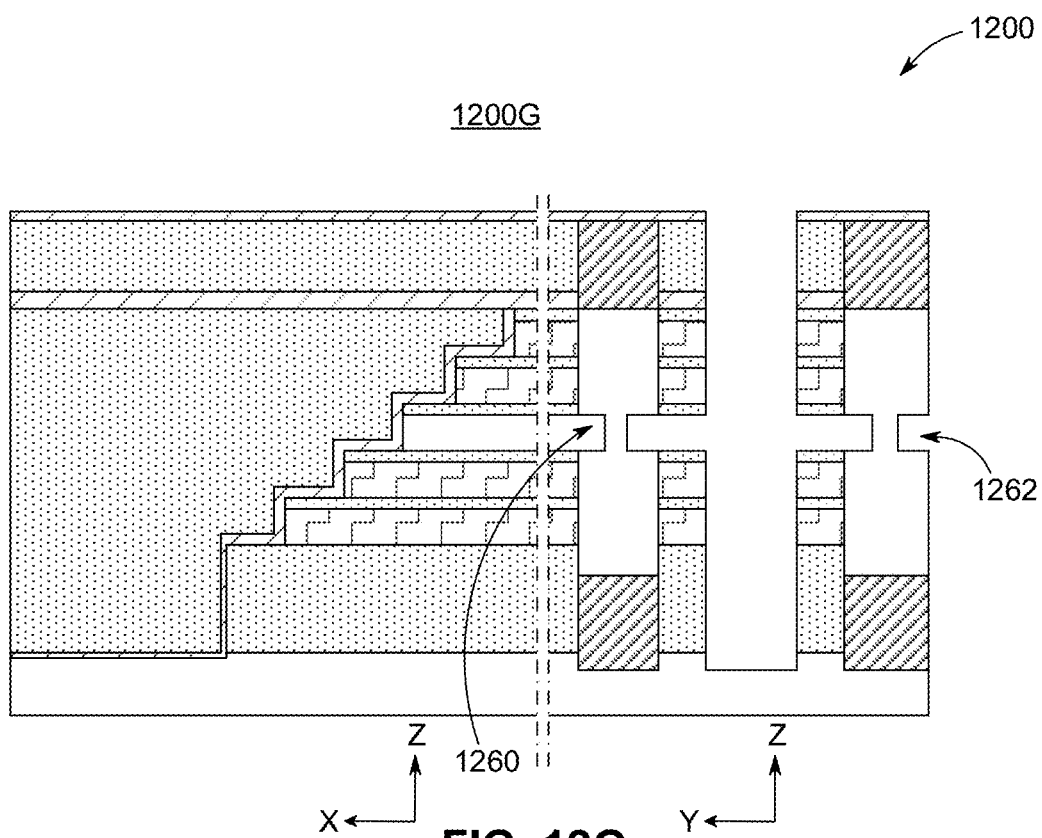

In step 1200G, as shown in the example of FIGS. 5 and 12G, first and second pillars 1240, 1242 are recessed to form first recessed pillar 1260 and second recessed pillar 1262, respectively. In some aspects, the recessing first and second pillars 1240, 1242 can include etching first and second pillars 1240, 1242 at about a midline to form first and second recessed pillars 1260, 1262, respectively, between a first memory cell (e.g., first DFM cell 540 shown in FIG. 5) and a second memory cell (e.g., second DFM cell 560 shown in FIG. 5). In some aspects, first and second recessed pillars 1260, 1262 can be configured to form a control gate (e.g., CG 550 shown in FIG. 5). In some aspects, first and second recessed pillars 1260, 1262 can be configured to form first and second memory cells (e.g., first and second DFM cells 540, 560 shown in FIG. 5), where first memory cell (e.g., first DFM cell 540 shown in FIG. 5) is coupled to first and second top contacts 1244, 1246 and second memory cell (e.g., second DFM cell 560 shown in FIG. 5) is coupled to first and second bottom contacts 1230, 1232, respectively.

Figure 12H:
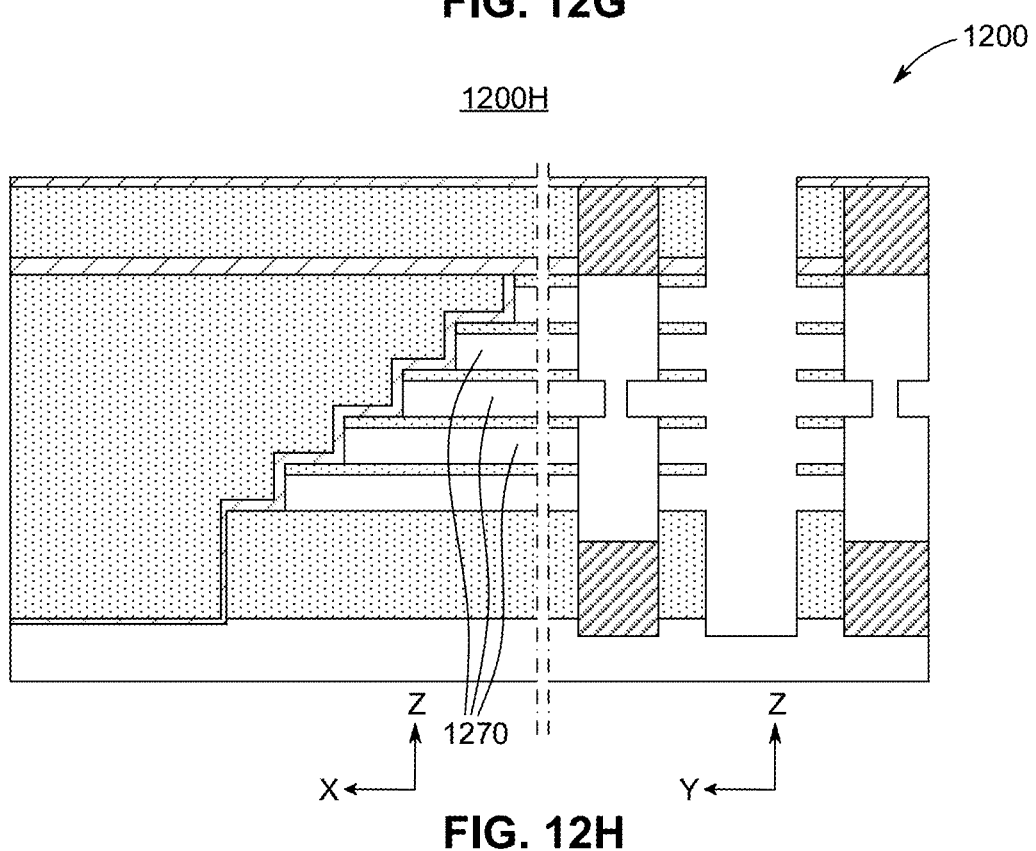

In step 1200H, as shown in the example of FIG. 12H, second dielectric layer 1208 (e.g., silicon nitride) of stack 1204 is removed to form dielectric layer void 1270. In some aspects, second dielectric layer 1208 can be removed by etching from a lateral edge of stack 1204, for example, isotropic etching.

Figure 12I:
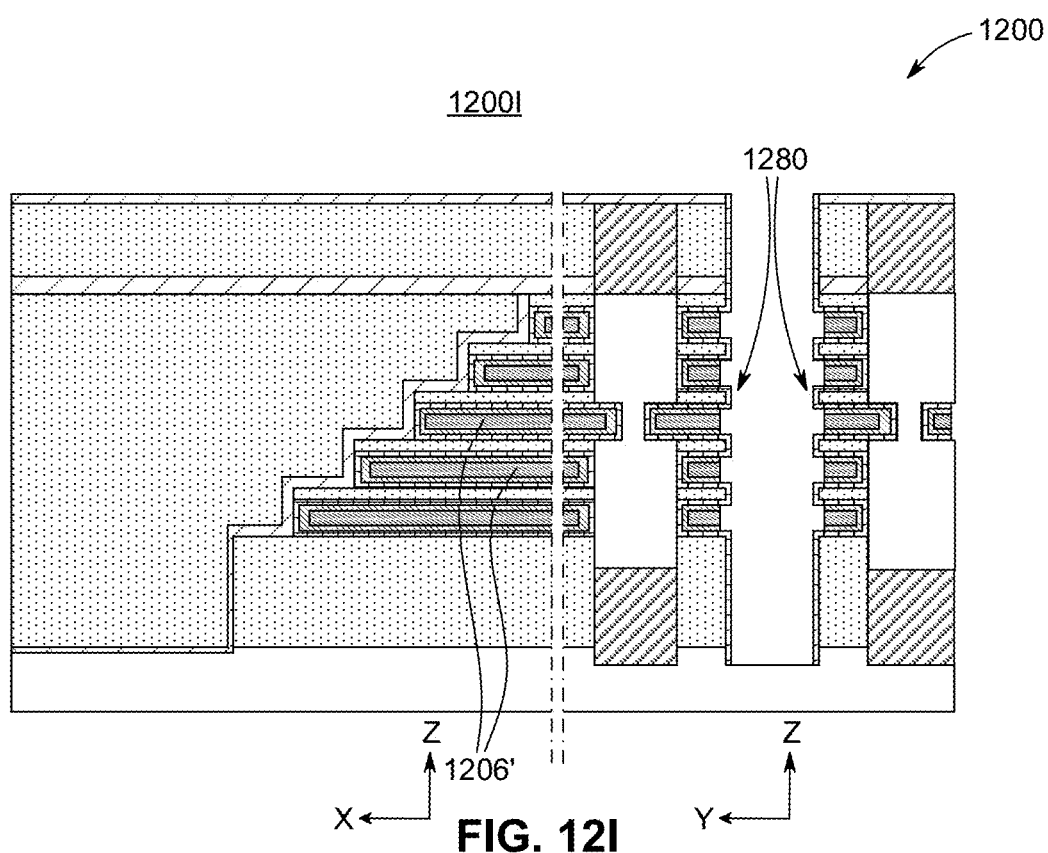

In step 1200I, as shown in the example of FIGS. 12H and 12I, high-k metal gate (HKMG) stack 1280 is formed with conductive layers 1206' in dielectric layer void 1270. In some aspects, conductive layers 1206' can include a conductive material, for example, a metal, a doped semiconductor, polysilicon, tungsten, and/or any other suitable conductor.

Figure 12J:
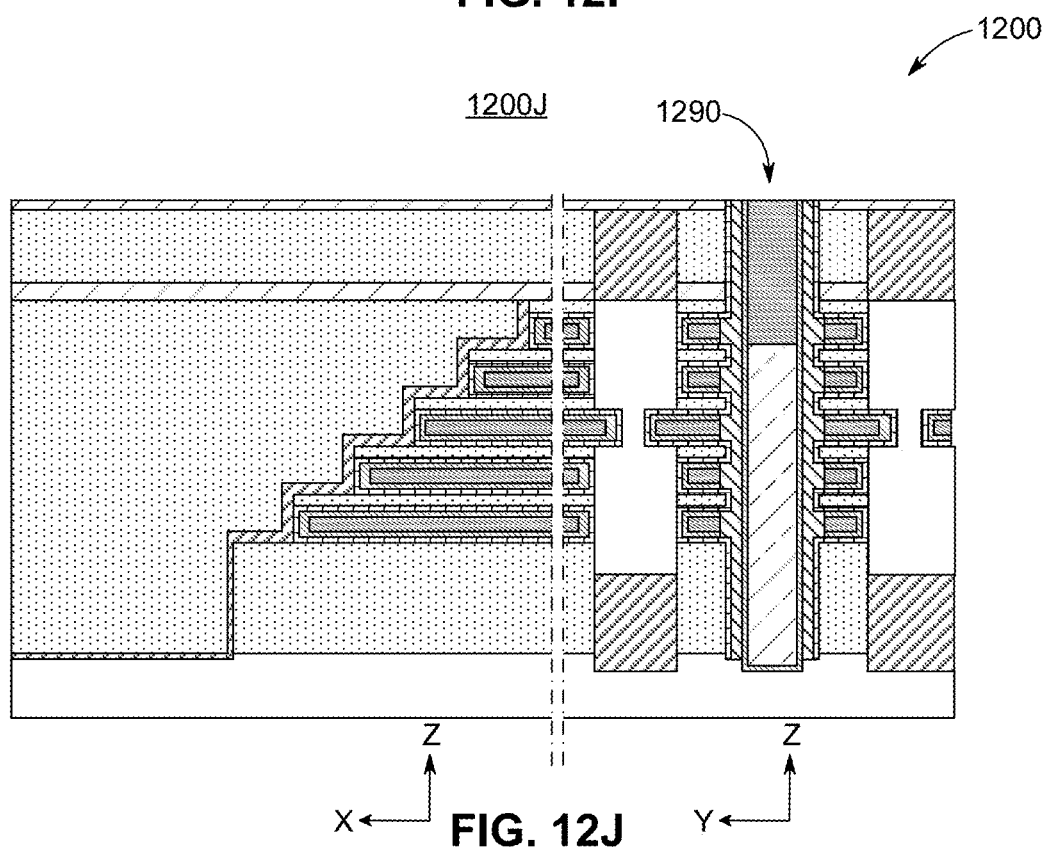

In step 1200J, as shown in the example of FIGS. 12E and 12J, gate line slit (GLS) 1290 is formed in gate line trench 1250. In some aspects, GLS 1290 can provide a conductive pathway through an alternating dielectric stack (e.g., HKMG stack 1280), for example, between adjacent memory blocks or adjacent memory cells (e.g., first and second DFM cells 540, 560). In some aspects, GLS 1290 can provide connection to HKMG stack 1280 in a memory device (e.g., multi-cell DFM device 500). In some aspects, GLS 1290 can extend vertically through the alternating dielectric stack (e.g., HKMG stack 1280) and extend horizontally between two adjacent arrays of memory blocks or memory cells (e.g., first and second DFM cells 540, 560).

In step 1200K, as shown in the example of FIGS. 5, 12C, 12D, 12G, and 12K, interconnects 1295 are formed to first and second top contacts 1244, 1246 (e.g., BL 520), first and second pillars 1240, 1242 (e.g., first and second DFM cells 540, 560), first and second recessed pillars 1260, 1262 (e.g., CG 550), and first and second bottom contacts 1230, 1232 (e.g., SL 530), respectively, to form one or more multi-cell DFM devices 500 shown in FIG. 5. In some aspects, manufacturing method 1200 can include forming a DFM device, for example, multi-cell DFM device 500 shown in FIG. 5. In some aspects, manufacturing method 1200 can include forming a NAND DFM device.

Exemplary Flow Diagram

Figure 13:
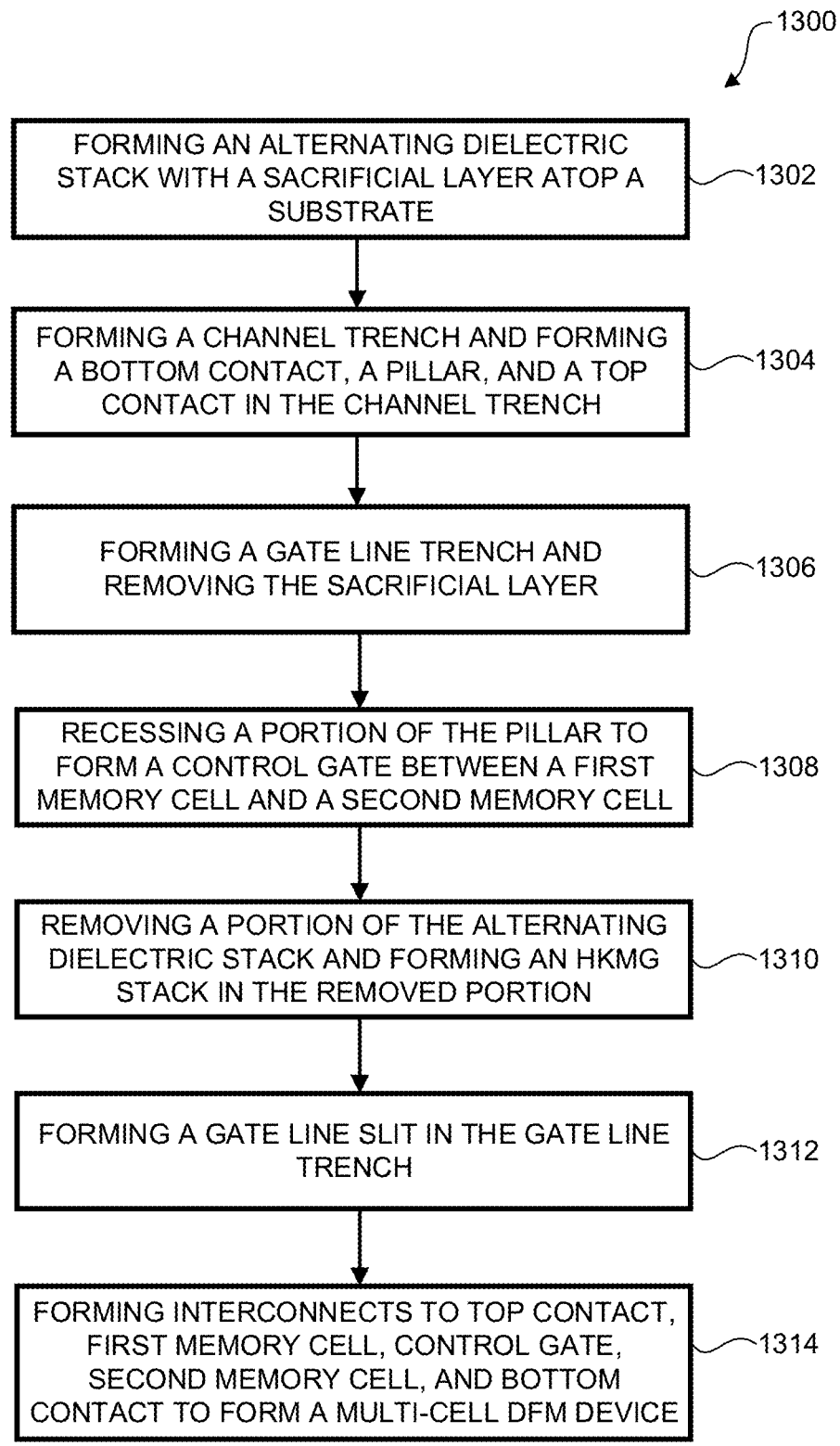
FIG. 13 illustrates a flow diagram for forming the multi-cell DFM device shown in FIG. 5, according to an exemplary aspect.

FIG. 13 illustrates flow diagram 1300 for forming multi-cell DFM device 500 shown in FIG. 5, according to exemplary aspects. It is to be appreciated that not all steps in FIG. 13 are needed to perform the disclosure provided herein. Further, some of the steps may be performed simultaneously, sequentially, and/or in a different order than shown in FIG. 13. Flow diagram 1300 shall be described with reference to FIGS. 5 and 12A through 12K. However, flow diagram 1300 is not limited to those example aspects.

In step 1302, as shown in the example of FIG. 12A, stack 1204 with staircase structure 1205 including first dielectric layer 1206 (e.g., silicon oxide), second dielectric layer 1208 (e.g., silicon nitride), and sacrificial layer 1210 (e.g., polysilicon), bottom isolation layer 1212, and top isolation layer 1214 are formed as an alternating dielectric stack atop substrate 1202. In some aspects, sacrificial layer 1210 can include silicon, polysilicon, aluminum, chromium, gold, platinum, titanium, tungsten, or any other material not reactive to silicon oxide and silicon nitride etchants.

In step 1304, as shown in the example of FIGS. 12B-12D, first channel trench 1220 and second channel trench 1222 are formed in the alternating dielectric stack (e.g., stack 1204). In some aspects, first and second channel trenches 1220, 1222 can be formed by etching in alternating dielectric stack, for example, anisotropic etching. Further, first bottom contact 1230 and second bottom contact 1232 are formed in first and second channel trenches 1220, 1222, respectively. In some aspects, forming first and second bottom contacts 1230, 1232 can include epitaxially growing first and second bottom contacts 1230, 1232, for example, by SEG. Further, first pillar 1240 and second pillar 1242 are formed atop first and second bottom contacts 1230, 1232, respectively, and first top contact 1244 and second top contact 1246 are formed atop first and second pillars 1240, 1242, respectively. In some aspects, forming first and second pillars 1240, 1242 can include epitaxially growing first and second pillars 1240, 1242 atop first and second bottom contacts 1230, 1232, for example, by SEG. In some aspects, forming first and second top contacts 1244, 1246 can include doping first and second pillars 1240, 1242 to form first and second top contacts 1244, 1246, for example, by ion implanting.

In step 1306, as shown in the example of FIGS. 12E and 12F, gate line trench 1250 is formed in the alternating dielectric stack (e.g., stack 1204). Further, sacrificial layer 1210 (e.g., polysilicon) is removed in the stack 1204 to form sacrificial layer void 1252. In some aspects, sacrificial layer 1210 can be removed by etching, for example, TMAH, KOH, EDP, HCl, aqua regia, SC1 solution, $Cl_2$, $CCl_4$, $BCl_3$, or any other etchant not reactive to silicon oxide and silicon nitride.

In step 1308, as shown in the example of FIG. 12G, first and second pillars 1240, 1242 are recessed to form first recessed pillar 1260 and second recessed pillar 1262, respectively. In some aspects, the recessing first and second pillars 1240, 1242 can include etching first and second pillars 1240, 1242 at about a midline to form first and second recessed pillars 1260, 1262, respectively, between a first memory cell (e.g., first DFM cell 540 shown in FIG. 5) and a second memory cell (e.g., second DFM cell 560 shown in FIG. 5). In some aspects, first and second recessed pillars 1260, 1262 can be configured to form a control gate (e.g., CG 550 shown in FIG. 5). In some aspects, first and second recessed pillars 1260, 1262 can be configured to form first and second memory cells (e.g., first and second DFM cells 540, 560 shown in FIG. 5), where first memory cell (e.g., first DFM cell 540 shown in FIG. 5) is coupled to first and second top contacts 1244, 1246 and second memory cell (e.g., second DFM cell 560 shown in FIG. 5) is coupled to first and second bottom contacts 1230, 1232, respectively.

In step 1310, as shown in the example of FIGS. 12H and 12I, second dielectric layer 1208 (e.g., silicon nitride) of stack 1204 is removed to form dielectric layer void 1270. In some aspects, second dielectric layer 1208 can be removed by etching from a lateral edge of stack 1204, for example, isotropic etching. Further, HKMG stack 1280 is formed with conductive layers 1206' in dielectric layer void 1270.

In step 1312, as shown in the example of FIG. 12J, GLS 1290 is formed in gate line trench 1250.

In step 1314, as shown in the example of FIGS. 5 and 12K, interconnects 1295 are formed to first and second top contacts 1244, 1246 (e.g., BL 520), first and second pillars 1240, 1242 (e.g., first and second DFM cells 540, 560), first and second recessed pillars 1260, 1262 (e.g., CG 550), and first and second bottom contacts 1230, 1232 (e.g., SL 530), respectively, to form one or more multi-cell DFM devices 500 shown in FIG. 5. In some aspects, flow diagram 1300 can include forming a DFM device, for example, multi-cell DFM device 500 shown in FIG. 5. In some aspects, flow diagram 1300 can include forming a NAND DFM device.

It is to be understood that the phraseology or terminology herein is for the purpose of description and not of limitation, such that the terminology or phraseology of the present specification is to be interpreted by those skilled in relevant art(s) in light of the teachings herein.

The term "substrate" as used herein describes a material onto which material layers are added. In some aspects, the substrate itself may be patterned and materials added on top of it may also be patterned, or may remain without patterning.

The following examples are illustrative, but not limiting, of the aspects of this disclosure. Other suitable modifications and adaptations of the variety of conditions and parameters normally encountered in the field, and which would be apparent to those skilled in the relevant art(s), are within the spirit and scope of the disclosure.

While specific aspects have been described above, it will be appreciated that the aspects may be practiced otherwise than as described. The description is not intended to limit the scope of the claims.

It is to be appreciated that the Detailed Description section, and not the Summary and Abstract sections, is intended to be used to interpret the claims. The Summary and Abstract sections may set forth one or more but not all exemplary aspects as contemplated by the inventor(s), and thus, are not intended to limit the aspects and the appended claims in any way.

The aspects have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific aspects will so fully reveal the general nature of the aspects that others can, by applying knowledge within the skill of the art, readily modify and/or adapt for various applications such specific aspects, without undue experimentation, without departing from the general concept of the aspects. Therefore, such adaptations and modifications are intended to be within the meaning and range of equivalents of the disclosed aspects, based on the teaching and guidance presented herein.

The breadth and scope of the aspects should not be limited by any of the above-described exemplary aspects, but should be defined only in accordance with the following claims and their equivalents.

What is claimed is:

1. A three-dimensional memory device comprising:
   a first memory cell comprising:
   a first pillar configured to store a first electrical charge;

a first insulating layer surrounding the first pillar;
a first gate contact surrounding a first portion of the first insulating layer, the first gate contact coupled to a first word line configured to address and non-destructively read the first pillar; and
a second gate contact surrounding a second portion of the first insulating layer, the second gate contact coupled to a first plate line configured to program the first pillar;
a second memory cell comprising:
a second pillar configured to store a second electrical charge;
a second insulating layer surrounding the second pillar;
a third gate contact surrounding a first portion of the second insulating layer, the third gate contact coupled to a second word line configured to address and non-destructively read the second pillar; and
a fourth gate contact surrounding a second portion of the second insulating layer, the fourth gate contact coupled to a second plate line configured to program the second pillar;
a control gate between the first and second memory cells and configured to provide a charge isolation region between the first and second memory cells, the control gate comprising:
a recessed pillar;
a recessed insulating layer surrounding the recessed pillar; and
a control gate contact surrounding the recessed insulating layer;
a top contact coupled to the first memory cell, the top contact coupled to a bit line configured to flow electrical charge through the first and second memory cells; and
a bottom contact coupled to the second memory cell, the bottom contact coupled to a source line configured to flow electrical charge through the first and second memory cells,
wherein the first word line is closer to the top contact than the first plate line, the control gate is between the second and fourth gate contacts and the third gate contact is adjacent to the source line.

2. The memory device of claim 1, wherein:
the first pillar, the recessed pillar, and the second pillar are a monolithic vertical pillar, and
the first insulating layer, the recessed insulating layer, and the second insulating layer are a monolithic insulating layer.

3. The memory device of claim 1, wherein the three-dimensional memory device comprises a three-state logic and is configured to increase storage density.

4. The memory device of claim 1, wherein the first and second memory cells are configured to be independently addressed and configured to be charged separately.

5. The memory device of claim 1, wherein, in a first logic state, the first pillar of the first memory cell comprises the first electrical charge.

6. The memory device of claim 5, wherein, in the first logic state, the top contact has a voltage of about 0.5 V to about 1.2 V, the first gate contact has a voltage of about 1 V to about 2 V, the second gate contact has a voltage of about 0.5 V to about 1.2 V, the control gate contact has a voltage of about 0.8 V to about 1.5 V, the third gate contact has a voltage of about 0.5 V to about 1.5 V, the fourth gate contact has a voltage of about 0.5 V to about 1.2 V, and the bottom contact has a voltage of about 0 V.

7. The memory device of claim 1, wherein, in a second logic state, the first pillar of the first memory cell comprises the first electrical charge and the second pillar of the second memory cell comprises the second electrical charge.

8. The memory device of claim 7, wherein, in the second logic state, the top contact has a voltage of about 0.8 V to about 1.5 V, the first gate contact has a voltage of about 1 V to about 2 V, the second gate contact has a voltage of about 0.5 V to about 1.2 V, the control gate contact has a voltage of about 0.8 V to about 1.5 V, the third gate contact has a voltage of about 0.5 V to about 1.5 V, the fourth gate contact has a voltage of about 0.5 V to about 1.2 V, and the bottom contact has a voltage of about 0 V.

9. The memory device of claim 1, wherein, in a third logic state, the first pillar of the first memory cell and the second pillar of the second memory cell comprise substantially no electrical charge.

10. The memory device of claim 9, wherein, in the third logic state, the top contact has a voltage of about 0 V, the first gate contact has a voltage of about 0 V, the second gate contact has a voltage of about 0.5 V to about 1.5 V, the control gate contact has a voltage of about 0.5 V to about 1.5 V, the third gate contact has a voltage of about 0.5 V to about 1.5 V, the fourth gate contact has a voltage of about 0.5 V to about 1.5 V, and the bottom contact has a voltage of about −1 V to about −3V.

11. A vertical three-dimensional (3D) memory device comprising:
a first memory cell configured to read, program, and erase a first electrical charge;
a second memory cell configured to read, program, and erase a second electrical charge;
a control gate between the first and second memory cells and configured to provide a charge isolation region between the first and second memory cells;
a top contact coupled to the first memory cell, the top contact coupled to a bit line configured to flow electrical charge through the first and second memory cells; and
a bottom contact coupled to the second memory cell, the bottom contact coupled to a source line configured to flow electrical charge through the first and second memory cells;
wherein the first memory cell comprises a first gate contact and a second gate contact coupled to a first plate line, the second memory cell comprises a third gate contact and a fourth gate contact coupled to a second plate line; and
wherein a first word line is closer to the top contact than the first plate line, the control gate is between the second and fourth gate contacts and the third gate contact is adjacent to the source line.

12. The vertical 3D memory device of claim 11, wherein the vertical 3D memory device comprises a dynamic flash memory (DFM) device.

13. The vertical 3D memory device of claim 12, wherein the vertical 3D memory device comprises a NAND DFM device.

14. The vertical 3D memory device of claim 11, wherein the charge isolation region has a charge density of no greater than $1\times10^{14}$ cm-3.

* * * * *